(12) United States Patent
Wu et al.

(10) Patent No.: US 12,721,120 B2
(45) Date of Patent: Aug. 25, 2026

(54) SEMICONDUCTOR STRUCTURES WITH IMPROVED METAL CAPPING LAYERS

(71) Applicant: Taiwan Semiconductor Manufacturing Company, Ltd., Hsinchu (TW)

(72) Inventors: Cheng-Hsiang Wu, New Taipei City (TW); Tsung-Yang Hsieh, New Taipei City (TW); Chien-Chang Lee, Hsinchu City (TW); Wen-Tung Chuang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 494 days.

(21) Appl. No.: 18/342,680

(22) Filed: Jun. 27, 2023

(65) Prior Publication Data

US 2025/0006553 A1 Jan. 2, 2025

(51) Int. Cl.
*H10W 20/00* (2026.01)
*H10W 20/20* (2026.01)
(Continued)

(52) U.S. Cl.
CPC ....... *H10W 20/037* (2026.01); *H10W 20/023* (2026.01); *H10W 20/062* (2026.01);
(Continued)

(58) Field of Classification Search
CPC ........... H01L 21/76849; H01L 21/7684; H01L 21/76898; H01L 23/481; H01L 24/08;
(Continued)

(56) References Cited

U.S. PATENT DOCUMENTS 7,858,510 B1 * 12/2010 Banerji ............. H01L 23/53295 427/96.8
2018/0211911 A1 7/2018 Wu et al.
2022/0084940 A1 * 3/2022 Chen ................... H01L 23/5226

FOREIGN PATENT DOCUMENTS

TW 202234539 A 9/2022

OTHER PUBLICATIONS

The First Office Action received in the counterpart Taiwan application 112148225, mailed on May 27, 202244.

* cited by examiner

*Primary Examiner* — Herve-Louis Y Assouman
(74) *Attorney, Agent, or Firm* — Kilpatrick Townsend & Stockton LLP

(57) ABSTRACT

Semiconductor structures and fabrication methods are provided. In one example, a method includes forming a first dielectric layer on a semiconductor structure. The semiconductor structure includes a substrate and a multi-layer interconnect (MLI) structure on the substrate. The MLI structure includes multiple metallization layers. The first dielectric layer is formed on a topmost metallization layer. The method further includes forming a through-substrate-via (TSV) opening extending vertically through the first dielectric layer and the multiple metallization layers into the substrate, forming a TSV in the TSV opening, performing a first planarization process to planarize the TSV, forming multiple first metal vias and first metal lines in the first dielectric layer after the first planarization process, forming multiple first metal capping layers respectively on the multiple first metal lines, and performing a second planarization process to planarize the first metal capping layers.

20 Claims, 22 Drawing Sheets

(51) Int. Cl.
*H10W 20/40* (2026.01)
*H10W 20/41* (2026.01)
*H10W 20/42* (2026.01)
*H10W 90/00* (2026.01)
*H10W 90/20* (2026.01)

(52) U.S. Cl.
CPC ........... *H10W 20/20* (2026.01); *H10W 90/00* (2026.01); *H10W 90/297* (2026.01); *H10W 90/792* (2026.01)

(58) Field of Classification Search
CPC ....... H01L 25/0657; H01L 2224/08145; H01L 2225/06541; H01L 23/522; H01L 21/76838; H01L 21/7685; H01L 21/76877; H01L 21/76895; H01L 23/5226; H01L 23/5283; H10W 20/037; H10W 20/023; H10W 20/062; H10W 20/20; H10W 90/00; H10W 90/297; H10W 90/792; H10W 20/0245; H10W 20/2134; H10W 20/40; H10W 20/038; H10W 20/031; H10W 20/056; H10W 20/0698; H10W 20/42; H10W 20/435
See application file for complete search history.

100
104
BEOL
M3
M2
M1
M0
101
102
103
111
113
121
123
131
133
135
141
142
144
165
165a
165b
166
171
173
190
Z
X
Y 100
104
BEOL
M0
M1
M2
M3
M4
M5
101
102
103
111
113
121
123
131
133
135
141
142
143
145
146
151
152
155
156
171
173
177
178
190
T0
X
Y
Z 178
171
177
177
177

178
171
177
177

178
171
177

178
177
171

178
171
177

Z
Y
X

SEMICONDUCTOR STRUCTURES WITH IMPROVED METAL CAPPING LAYERS

FIELD

Embodiments of the present disclosure relate generally to semiconductor fabrication, and more particularly to forming a semiconductor structure with improved metal capping layers.

BACKGROUND

Electromigration is a phenomenon that occurs in metal components of semiconductor structures such as devices, dies, and integrated circuits, when the momentum of the electrons colliding with the metal atoms of the metal components causes the metal atoms to migrate towards the direction of the electron flow. Electromigration can cause unfavorable physical changes in the metal component and can seriously affect the functional performance of the semiconductor structures. For example, in an integrated circuit, a multi-layer interconnect (MLI) structure having multiple metal interconnects is often used to connect different parts of the circuit, and the metal interconnects are used as contact points for internal or external connections. When current flows through these metal interconnects, electromigration can occur and result in the formation of voids or cracks in the metal interconnects, which can further lead to an open circuit and device failure. There is a need to mitigate or prevent electromigration in integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
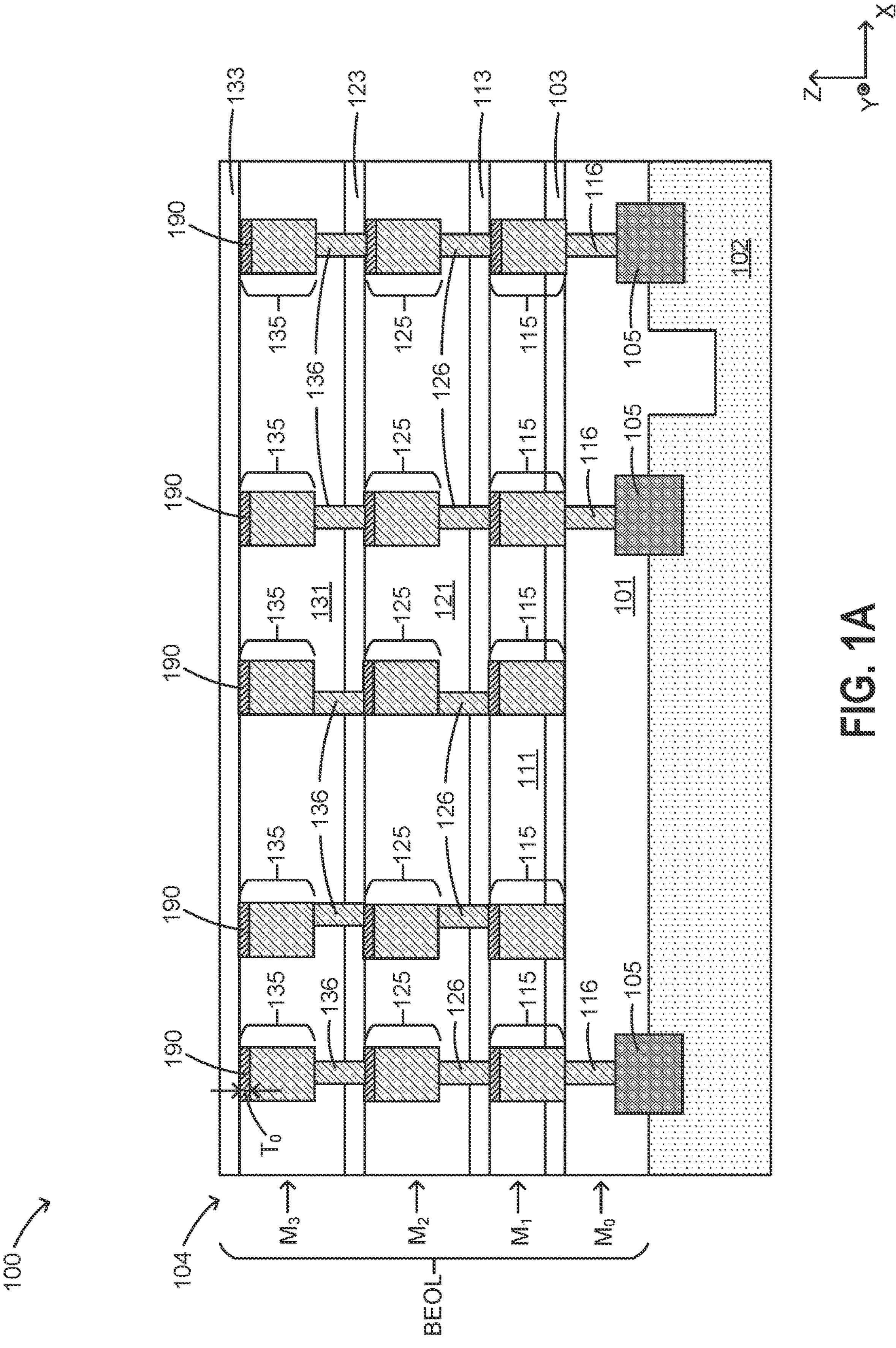
FIGS. 1A-1L schematically illustrate cross-sectional views of intermediate stages in the formation of an example semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and may not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Modern integrated circuits and semiconductor devices, such as a microprocessor or memory chip, typically include both a multi-layer interconnect (MLI) structure and a through-substrate via (TSV) to achieve higher levels of integration and functionality.

The MLI structure is a set of metallization layers (sometimes also referred to as "metal layers") that are added on one side of a substrate. The metallization layers are patterned to form a complex network of interconnects that connect the different components together. Each metallization layer is formed in a corresponding dielectric layer and includes multiple horizontal metal features (i.e., metal lines) and vertical metal features (i.e., metal vias) formed in the corresponding dielectric layer.

A metal line in an already formed metallization layer of the MLI structures usually has a metal capping layer (sometimes also referred to as a "capping layer") formed in a very thin top portion of the metal line. The metal capping layer includes a capping element (e.g., a transition metal) used to form a diffusion barrier to reduce the diffusion of metal atoms during electromigration. Despite the relatively small thickness, metal capping layers are very effective to prevent electromigration. According to some embodiments of the present disclosure, metal capping layers are formed by doping the top portion of the metal lines with a desired capping element and then performing a planarization process (e.g., a chemical-mechanical-polish (CMP) process) to planarize the top surface of the metal capping layer and achieve a desired thickness. Because the metal capping layers are thin in nature, they can be damaged or entirely lost under excessive planarization or local erosion.

On the other hand, TSVs are used as electrical paths in the semiconductor devices, so that the conductive features on opposite sides of the substrate may be interconnected. A TSV usually has a top surface located in a metallization layer of the MLI structure, extends from the top surface downwardly through the metallization layers thereunder, and penetrates the underlying substrate. The metallization layer where a top surface of the TSV is located is often referred to as the "TSV insert metallization layer," "TSV insert layer," or "TSV metallization layer." According to some embodiments of the present disclosure, formation of a TSV includes initiating a TSV opening, filling the TSV opening with a conductive material to form the TSV, performing a planarization process (e.g., a CMP process) to planarize the top surface of the TSV.

In a conventional process, a metallization layer of the MLI structure is usually formed prior to forming a TSV. For example, an already formed metallization layer is used as a TSV insert metallization layer, where a TSV opening is subsequently initiated, a TSV material is deposited in the TSV opening, and a CMP process is performed to form the TSV. However, this may raise serious issues. The already formed metal lines in the TSV insert metallization layer will undergo an additional CMP process (i.e., the CMP process used for forming the TSV). As described above, the already formed metal lines have a thin metal capping layer at the top, and the additional CMP can induce local erosion, which may substantially damage the metal capping layer. In a worse situation, the metal capping layer may be entirely removed by the additional CMP after the formation of the TSV. Damage or removal of the metal capping layer may cause degraded performance of electromigration resistance, crack of metal lines, high failure rate, and shortened device lifetime.

The present disclosure provides techniques to address the above-mentioned challenges. One insight provided by the present disclosure is related to a novel method for forming a TSV structure in a semiconductor structure having a MLI structure. According to some embodiments, a TSV is formed prior to the formation of the TSV insert metallization layer in the MLI structure. For example, a dielectric layer is formed on a topmost metallization layer of an MLI structure, a TSV opening is initiated in the dielectric layer, a conductive material is deposited to fill the TSV opening, and a CMP process is performed to form a TSV. After the TSV is formed, a new metallization layer (i.e., a TSV insert metallization layer) is formed in the dielectric layer. In this way, the metal lines of the new metallization layers will not undergo the CMP process for forming the TSV, and the metal capping layers of the metal lines in the new metallization layer will remain substantially the same thickness as compared to other metal lines in the metallization layers below the TSV insert metallization layer. Accordingly, the overall resistance to electromigration by the metal capping layers can be improved after the TSV is formed.

Another insight provided by the present disclosure is that the methods described herein allow more design flexibility. According to some embodiments, the top surface of the TSV may be leveled with the top surface of the TSV insert metallization layer or at an intermediate level in the TSV insert metallization layer. One or more TSV connectors may be formed to connect the top surface of the TSV to upper features above the TSV. According to some embodiments, additional metallization layers may be formed over the TSV insert metallization layer and the TSV. One or more TSV connectors may be formed in the additional metallization layers to connect the top surface of the TSV in the TSV insert metallization layer to upper features in and above the additional metallization layers. Because the metal lines in the TSV insert metallization layer are formed after forming the TSV, they will not undergo extra or excessive CMP treatment in subsequent operations and remain effective against electromigration in the final structure.

By implementation of the methods according to the present disclosure, the metal capping layers of the metal lines in the TSV insert metallization layer can be protected without performing extra processes, which is both manufacture-friendly and cost effective.

Example Semiconductor Structures with Improved Metal Capping Layers

FIGS. 1A-1L are schematic diagrams illustrating cross-sectional views of intermediate stages in the formation of an example semiconductor structure, in accordance with some embodiments. The operations shown in FIGS. 1A-1L are also illustrated schematically in method 400 of FIG. 4. In the subsequent discussion, the operations shown in FIGS. 1A-1L are also discussed referring to the operations in FIG. 4.

As illustrated in FIG. 1A, a semiconductor structure 100 is formed or provided. The semiconductor structure 100 includes, among other components, a substrate 102, a multilayer interconnect (MLI) structure 104 on the substrate 102, and one or more semiconductor devices 105. The substrate 102 may be a semiconductor substrate formed of a crystalline semiconductor material such as silicon, germanium, silicon germanium, a III-V compound semiconductor such as GaAsP, AlinAs, AlGaAs, GaInAs, GaInP, GaInAsP, and/or the like. The semiconductor substrate 102 may be a bulk silicon substrate or a Silicon-On-Insulator (SOI) substrate.

In accordance with some embodiments of the present disclosure, the semiconductor structure 100 is used to form a device die. In these embodiments, semiconductor devices 105 are formed at the top surface or in a top portion of substrate 102. Exemplary semiconductor devices 105 may include active and/or passive devices such as Complementary Metal-Oxide Semiconductor (CMOS) transistors, resistors, capacitors, diodes, and the like. Semiconductor devices 105 are fabricated using front-end-of-line (FEOL) of fabrication. The details of semiconductor devices 105 are not illustrated herein. In alternative embodiments, the semiconductor structure 100 is used for forming interposers. In these embodiments, no active devices such as transistors and diodes are formed at the surface of or in a top portion of the substrate 102. In some embodiments, the semiconductor structure 100 may be a wafer, and there may (or may not) be passive devices such as capacitors, resistors, inductors, or the like formed in the wafer. The substrate 102 may also be a dielectric substrate in the embodiments in which the semiconductor structure 100 is an interposer wafer. Furthermore, TSVs (not shown) may be formed to penetrate through the substrate 102 in order to interconnect the components on the opposite sides of the substrate 102.

The MLI structure 104 (sometimes also referred to as "interconnect structure") is disposed on the substrate 102 and is fabricated using back-end-of-line (BEOL) of fabrication. The MLI structure 104 includes a combination of dielectric layers, conductive layers, and etch stop layers configured to form various interconnect structures. The conductive layers and the dielectric layer where the conductive layers are formed are collectively referred to as metallization layers or M layers. The metallization layers are configured to form vertical interconnect features (e.g., device-level contacts, vias, etc.) and horizontal interconnect features (e.g., conductive or metal lines extending in a horizontal plane). Vertical interconnect features typically connect horizontal interconnect features in different metallization layers.

For example, a base metallization layer is often denoted as "$M_0$" layer, a first metallization layer is often denoted as "$M_1$" layer, a second metallization layer is often denoted as "$M_2$" layer, and so on. As a generalization, the $N^{th}$ metallization layer of the MLI structure 104 is denoted as "$M_N$" layer, and the metallization layer adjacently above the $M_N$ layer is denoted as "$M_{N+1}$" layer. The MLI structure 104 is generally configured to route or distribute signals (e.g., clock signals, voltage signals, ground signals) to the semiconductor devices 105 to fulfill certain functions. It should be understood that although the MLI structure 104 is depicted in FIG. 1A with a given number of dielectric layers and conductive layers, the present disclosure contemplates MLI structures having more or fewer dielectric layers and/or conductive layers depending on design requirements of the semiconductor structure 100.

As illustrated in FIG. 1A, the MLI structure 104 includes $M_0$ layer, $M_1$ layer, $M_2$ layer, and $M_3$ layer sequentially in the Z-direction. The $M_0$ layer is a base layer and includes multiple vertical interconnect features 116 (also referred to as vertical via, metal via, or via). $M_1$ layer includes multiple horizontal interconnect features 115 (also referred to as conductive lines, metal lines, horizontal metal features or the like) as well as multiple metal vias 116. $M_2$ layer includes multiple metal lines 125 and metal vias 126. $M_3$ layer is the topmost metallization layer and includes multiple metal lines 135 and metal vias 136. It should be noted that the topmost M layer (i.e., $M_3$ layer) shown in FIG. 1A is not intended to be limiting, and the topmost layer may be any metallization layer. As a generalization, an MLI structure may include multiple metallization layers $M_i$, wherein i=0, 1, . . . . N, N is an integer, and N>1, and the $M_N$ layer is the topmost metallization layer of the MLI structure. The metal lines and metal vias as described herein may be formed of copper, aluminum, copper alloys and can also be formed of other metals.

The semiconductor structure 100 shown in FIG. 1A is provided as a base structure for initiating and forming a through-substrate-via (also referred to as "TSV" or "through via") in a to-be-formed metallization layer next to and above the topmost metallization layer. In the illustrated example, the topmost metallization layer is $M_3$ layer, so the to-be-formed metallization layer is $M_4$ layer, which is above and next to the $M_3$ layer. For convenience, the metallization layer where a TSV is initiated (i.e., where a front end or top surface of the TSV is located) is denoted as a "TSV insert metallization layer" or "TSV metallization layer." In the example shown in FIG. 1A, the to-be-formed $M_4$ layer is the TSV insert metallization layer. As a generalization, in an IC device having a topmost metallization layer (i.e., $M_N$ layer), the TSV insert metallization layer is $M_{N+1}$ layer next to and above the $M_N$ layer. The metallization layers where no TSV is initiated (i.e., where the front end or top surface of the TSV is not locate) are denoted as "non-TSV insert metallization layer." In the example of FIG. 1A, the $M_1$, $M_2$, and $M_3$ layers may be non-TSV insert metallization layers.

In the MLI structure 104, the $M_0$ layer includes an Inter-Layer Dielectric (ILD) layer 101 where the metal vias 116 are formed. Similarly, the metallization layers above the $M_0$ layers (i.e., the $M_1$, $M_2$, and $M_3$ layers) are formed in dielectric layers 111, 121, and 131 (also referred to as Inter-Metal Dielectrics (IMDs)) and etch stop layers 103, 113, 123, and 133, respectively. In accordance with some embodiments, the ILD layer 101 is formed of silicon oxide, Phospho Silicate Glass (PSG), Boro Silicate Glass (BSG), Boron-doped Phospho Silicate Glass (BPSG), Fluorine-doped Silicate Glass (FSG), or the like. ILD 101 may be formed using spin coating, Flowable Chemical Vapor Deposition (FCVD), or the like. In accordance with some embodiments of the present disclosure, the ILD layer 101 may also be formed using a deposition method such as Plasma Enhanced Chemical Vapor Deposition (PECVD), Low Pressure Chemical Vapor Deposition (LPCVD), or the like.

Dielectric layers 111, 121, and 131 are formed of low-k dielectric materials. The dielectric constants (k values) of the low-k dielectric materials may be lower than about 3.0, for example. Dielectric layers 111, 121, and 131 may include a carbon-containing low-k dielectric material, Hydrogen SilsesQuioxane (HSQ), MethylSilsesQuioxane (MSQ), or the like. The formation of dielectric layers 111, 121, and 131 may include depositing a porogen-containing dielectric material in the dielectric layers 111, 121, and 131, and then performing a curing process to drive out the porogen, and hence the remaining dielectric layers 111, 121, and 131 are porous.

Each of the etch stop layers 103, 113, 123, and 133 may be deposited on the top of each of the ILD layer 101 and the dielectric layers 111, 121, and 131, respectively. The etch stop layers 103, 113, 123 may be formed of or include silicon nitride, silicon carbide, silicon oxycarbide, silicon oxynitride, or the like. In accordance with some embodiments, the top surfaces of each of the dielectric layers (e.g., dielectric layers 111, 121, and 131) and corresponding metal lines (e.g., 115, 125, and 135) are leveled with one another. Accordingly, the etch stop layers 103, 113, 123, and 133 may serve as a planar layer.

The formation of metal lines 115, 125, 135 and metal vias 116, 126, and 136 may include single damascene processes and/or dual damascene processes. In a single damascene process for forming a metal line or a via, a trench or a via opening is first formed in one of ILD layer 101 and dielectric layers 111, 121, and 131, followed by filling the trench or the via opening with a conductive material. A planarization process such as a chemical-mechanical-polish (CMP) process is then performed to remove the excess portions of the conductive material higher than the top surface of the dielectric layer, leaving a metal line or a via in the corresponding trench or via opening. In a dual damascene process, both of a trench and a via opening are formed in a dielectric layer 111, 121, and 131, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Each one of the metal lines 115, 125, and 135 further includes a metal capping layer 190 (also referred to as a "capping layer") on a top portion of the corresponding metal line. In some embodiments, the metal capping layers 190 are formed in the same process of forming the metal lines 115, 125, and 135 by changing the parameters of the metal line formation process. Alternatively, the metal capping layers 190 may be formed over the metal lines 115, 125, and 135 in a separate process such as CVD, ALD, or PVD. The metal capping layers 190 may include a transition metal such as cobalt (Co), tungsten (W), tantalum (Ta), nickel (Ni), molybdenum (Mo), manganese (Mn), titanium (Ti), iron (Fe), CoWP, CoB, or combinations thereof. In some embodiments, the metal capping layers 190 may be formed selectively using electroless plating, during which semiconductor structure 100 is submerged in a plating solution. In alternative embodiments, the metal capping layers 190 are blanket formed on the metal lines 115, 125, and 135 and dielectric layer 111, 121, and 131, for example, using Physical Vapor Deposition (PVD), followed by a photo lithography process to etch the undesirable portions.

The metal capping layers 190 play an important role in preventing or reducing undesired electromigration. The transition metal such as Co or Mn can form solid solutions with other metals commonly used in meta lines, such as copper (Cu) and aluminum (Al), which can help to reduce the diffusion of metal atoms during electromigration. In addition, transition metal such as Mn can form a diffusion barrier at the grain boundaries of the metal line, which can help to prevent the migration of metal atoms. In addition to preventing electromigration, the metal capping layers 190 also protect the metal lines from other forms of damage. For example, the metal capping layers 190 can protect the metal line from oxidation, which can weaken the metal line and lead to failure. The capping layer can also protect the metal line from physical damage, such as scratches or bumps, which can cause electrical shorts or opens.

The metal capping layers 190 may have a thickness ($T_0$) from about 10 to 1,000 nm, depending on the design requirements. During operation, a planarization process (e.g., a CMP process) is usually performed to form metal capping layers 190 with a substantially planar surface and uniform thickness across different metallization layers. In some embodiments, the metal capping layers of the metal lines in the non-TSV insert metallization layers (e.g., the $M_1$, $M_2$, and $M_3$ layers of FIG. 1A) may have an essentially uniform thickness sufficient to prevent electromigration. It should be noted that the metal capping layers are generally thin, and excess planarization (e.g., multiple CMP treatments) may significantly reduce the thickness of the metal capping layers and/or remove the entire metal capping layers. As a result, the resistance to electromigration can be seriously undermined, which could lead to damages to metal line, degradation of performance, and even device failure.

It should be noted that additional layers may be included in the MLI structure 104. For example, a passivation layer (not shown) may be formed on one of the etch stop layers 103, 113, 123, and 133 and disposed between the corresponding etch stop layer and the neighboring dielectric layer. The passivation layer may be formed of a non-low-k dielectric material having a dielectric constant equal to or greater than about the dielectric constant of silicon oxide. The passivation layer may be formed of or comprise an inorganic dielectric material, which may include a material selected from, and is not limited to, Undoped Silicate Glass (USG), silicon nitride (SiN), silicon oxide ($SiO_2$), silicon oxy-nitride (SiON), silicon oxy-carbide (SiOC), silicon carbide (SiC), or the like, combinations thereof, and/or multi-layers thereof. In accordance with some embodiments, the top surfaces of each of the dielectric layers (e.g., dielectric layers 111, 121, and 131) and corresponding metal lines (e.g., 115, 125, and 135) are leveled with one another. Accordingly, the passivation layer may also serve a planar layer.

Figure 1B:
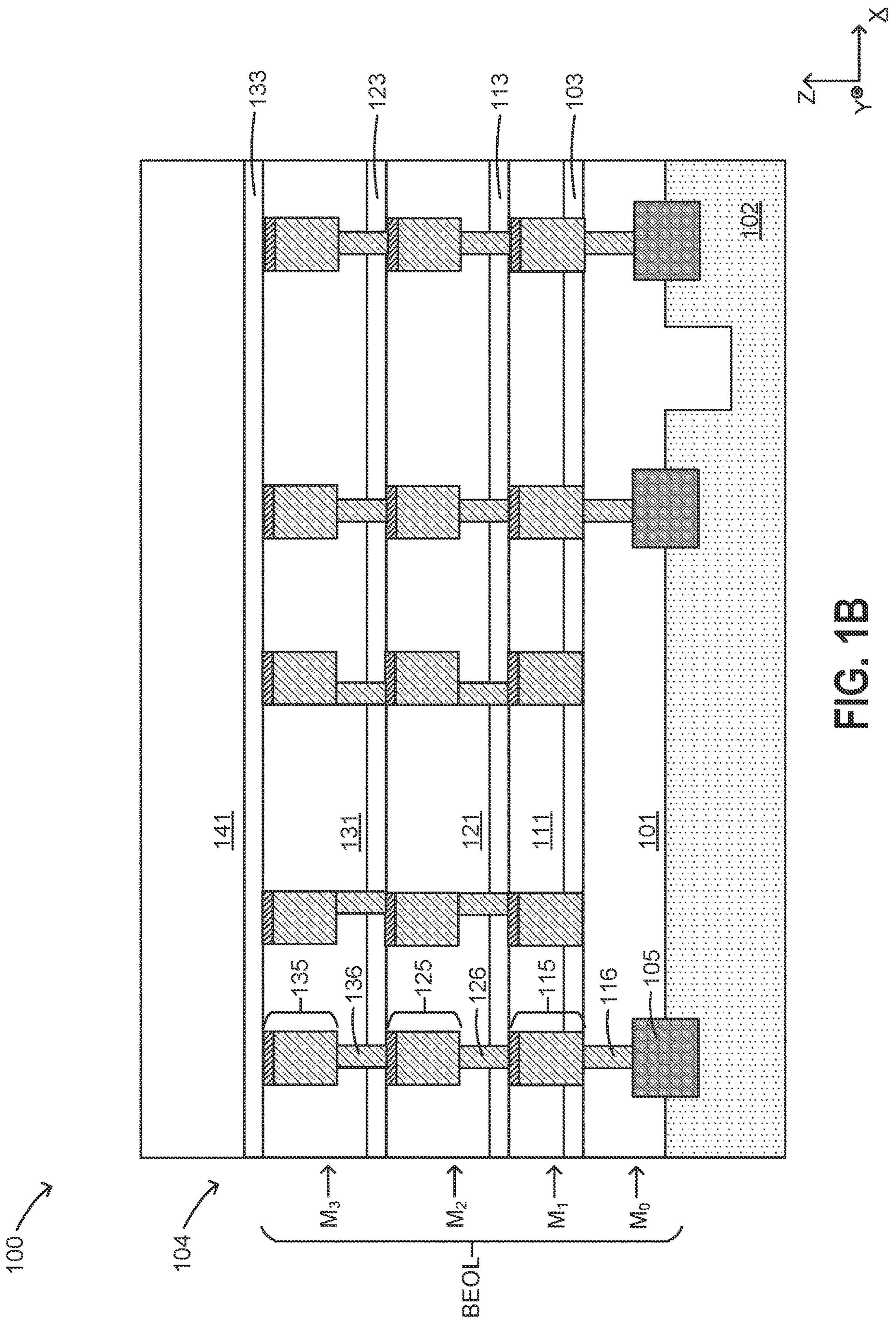

In the example of FIG. 1B, a dielectric layer 141 is formed on the etch stop layer 133. The dielectric layer 141 may be formed by similar process and include similar materials as other dielectric layers 111, 121, and 131. The dielectric layer 141 provides a base form forming the $M_4$ layer above the $M_3$ layer. A to-be-formed TSV (e.g., the TSV 171 of FIG. 1E) can be initiated in the dielectric layer 141 prior to the formation of the $M_4$ layer.

Figure 1C:
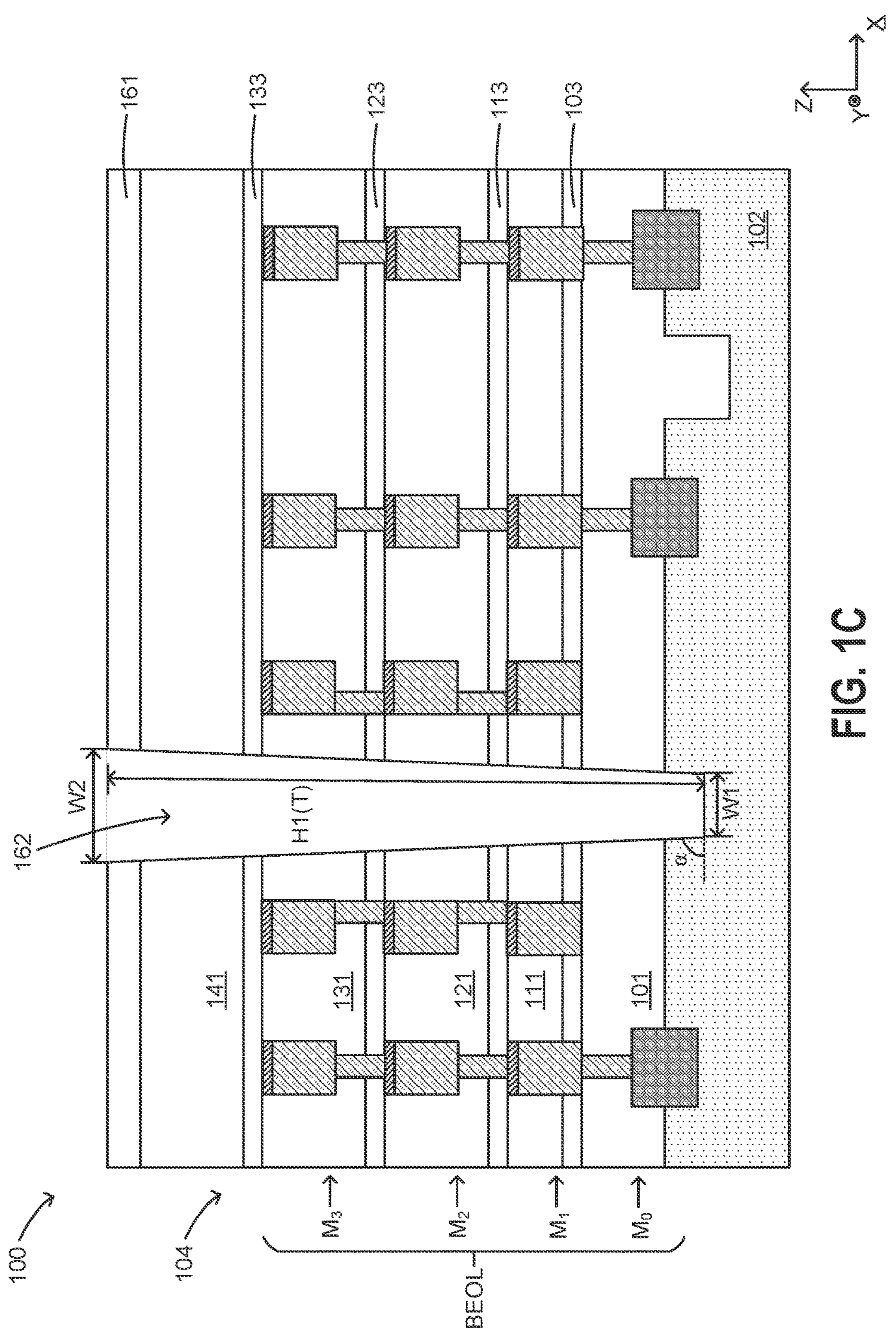

In the example of FIG. 1C, an etching mask 161 is formed and then patterned. In accordance with some embodiments, the etching mask 161 includes photo resist, and may or may not include a hard mask formed of TiN, BN, or the like. An anisotropic etching process is then performed to form an opening 162 penetrating through dielectric layers including the dielectric layer 141, 131, 121, 111, the ILD layer 101, the etch stop layers 133, 123, 113, and 103. The substrate 102 is further etched so that opening 162 extends to an intermediate level of substrate 102. The opening 162 is thus formed. The opening 162 is used for forming a TSV, and hence is referred to as TSV opening 162 hereinafter. The anisotropic etching process includes a plurality of etching processes, which adopt different etching gases in order to etch the dielectric layers that are formed of different materials, and to etch the substrate 102.

In accordance with some embodiments, the TSV opening 162 may have a top width (W1) and bottom width (W2) smaller than W1, and a height (T). The TSV opening 162 may have slanted-and-straight edges, wherein a tilt angle $\alpha$ of the straight edges are equal to or smaller than 90 degrees. For example, a may be in the range between about 80 degrees and about 90 degrees. An aspect ratio H1/W1 of the TSV opening 162 may be in the range between about 2 and about 10 in accordance with some embodiments. The etching mask 161 may be removed after the formation of the TSV opening 162, for example, through an ashing process. In some embodiments, one or more liners or barrier layers (not shown) may be formed on sidewalls that define of the TSV opening 162 prior to the formation of the TSV.

Figure 1D:
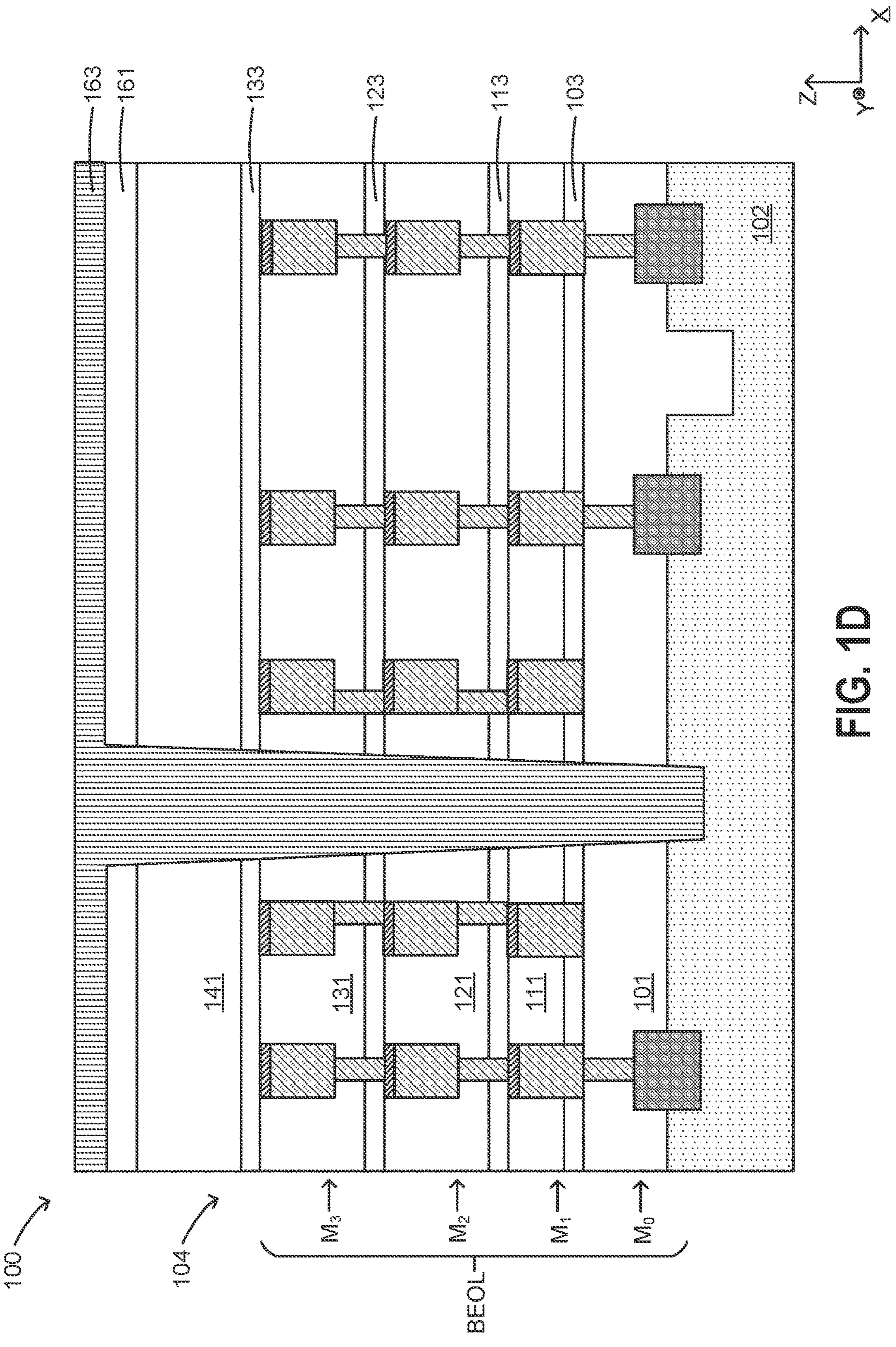

In the example of FIG. 1D, a conductive layer 163 is deposited and fill the TSV opening 162. The conductive layer 163 may include a metallic material such as copper or a copper alloy. The deposition process may be performed using electrochemical plating (ECP), electro-less plating, or the like. The plating is performed until the top surface of the plated conductive layer 163 is higher than the top surface of the etching mask 161 (or the dielectric layer 141 if the etching mask 161 is removed before deposition).

Figure 1E:
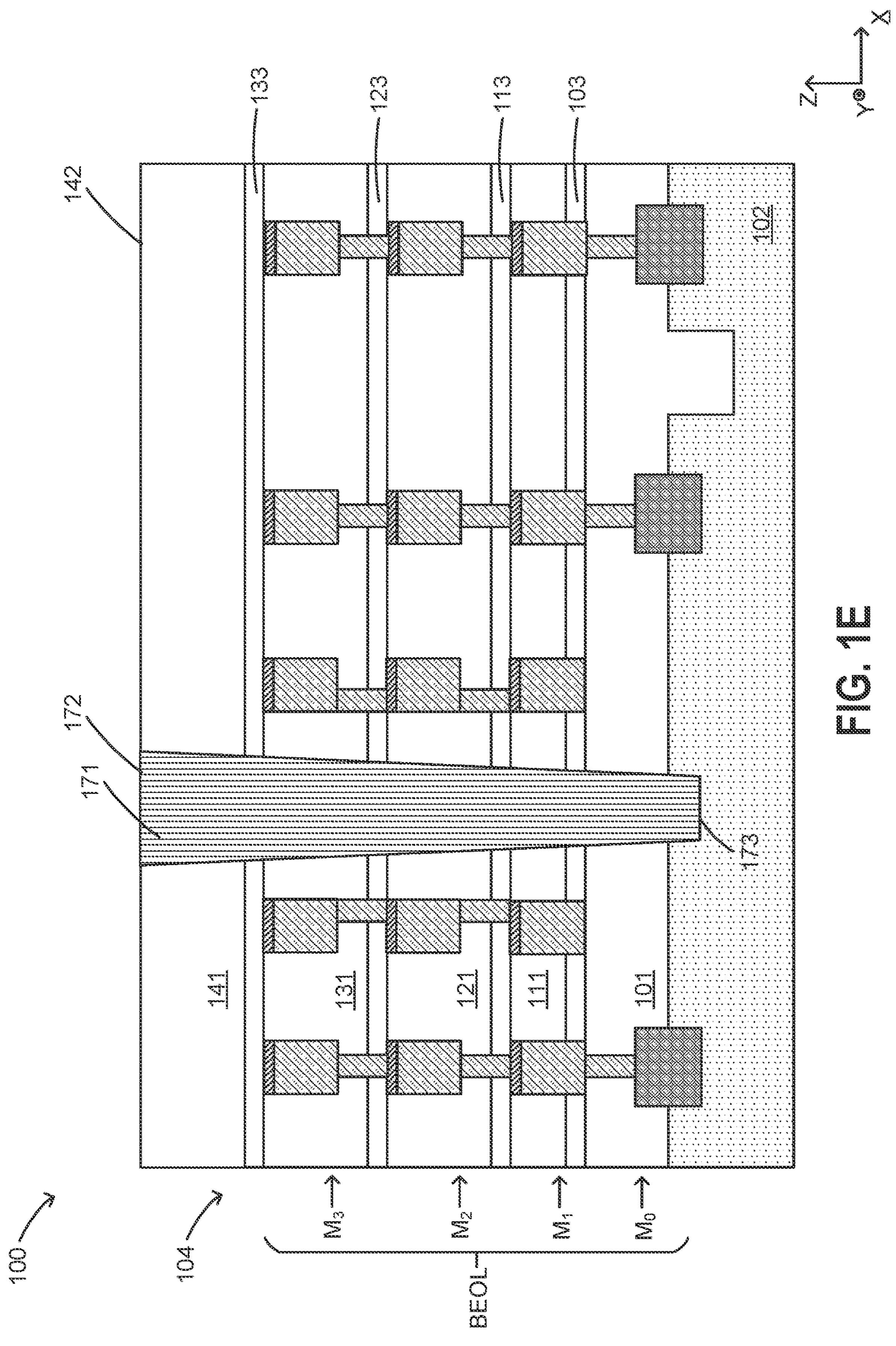

In the example of FIG. 1E, a first planarization process is performed to form a TSV 171. The first planarization process may be a first CMP process or a mechanical grinding process, performed to remove the excess material of the conductive layer 163 and planarize the conductive layer 163 to form the TSV 171. The TSV extends from a top surface 172 to a bottom surface 173. The top surface 172 aligned with top surface 142 of the dielectric layer 141, and the bottom surface 173 is at an intermediate level of the substrate 102. In accordance with some embodiments, the planarization process is performed using the dielectric layer 141 as a stop layer. Accordingly, the top surface 172 is coplanar or substantially leveled with the top surface 142 of dielectric layer 141. In accordance with alternative embodiments, the planarization process is performed using other dielectric layers such as a passivation layer (not shown) formed on the dielectric layer 141 as a CMP stop layer.

It should be noted that first planarization process to form the TSV 171 is performed prior to the formation of the TSV insert metallization layer (i.e., the to-be-formed $M_4$ layer) next to and above the $M_3$ layer. Thus, the to-be-formed metal lines and metal vias in the $M_4$ layer will not be subject to the first planarization process used to form the TSV 171. More details will be described below with references to FIGS. 1F-1I.

FIGS. 1F-1K illustrate the formation of upper features in accordance with some embodiments. It is appreciated that these processes are examples, and any other connection scheme are contemplated by the present disclosure.

Figure 1F:
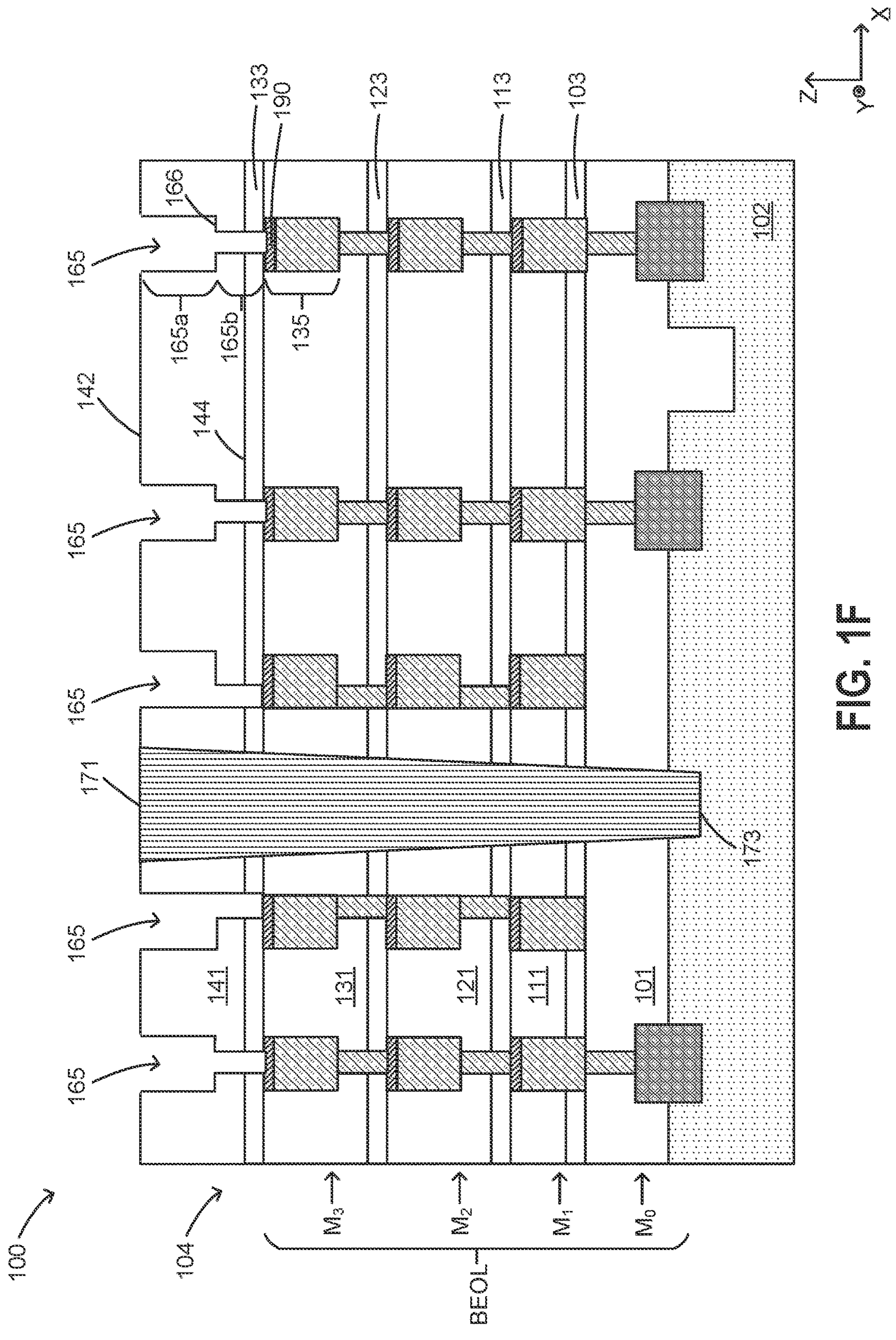

In the example of FIG. 1F, multiple openings 165 are formed to receive and accommodate metal lines as well as the metal vias for the to-be-formed $M_4$ layer. Each of the multiple openings 165 further includes a trench **165*a* and a via opening 165*b* connected at an interface 166. The trench 165*a* is configured to accommodate a metal line, and the via opening 165*b* is configured to accommodate a metal via connected to the metal line formed in the trench 165*a*. The trench 165*a* extends vertically from the top surface 142 of the dielectric layer 141 to the interface 166, and the via opening 165*b* extends from the interface 166 to a top surface of the metal capping layer 190 of the corresponding metal line 135 in the $M_3$ layer. The via opening 165*b* may have a small width (i.e., horizontal dimension) compared with the trench 165*a*. The relative position and dimension of the via opening 165*b* to the trench 165*a*** in the vertical direction may vary depending on design requirements.

In some embodiments, the processes for forming the openings 165 include performing a photolithography process to etch the dielectric layer 141 in order to form initial via openings, wherein the initial via openings extend from the top surface 142 of the dielectric layer 141 to an intermediate level between the top surface and a bottom surface 144 of the dielectric layer 141. Next, a metal hard mask (not shown) is formed and patterned to define the patterns of the trenches **165*a*. An anisotropic etching is then performed to etch the dielectric layer 141 to form trenches 165*a*. At the same time trenches 165*a* are formed, the via openings 165*b* extend down to the etch stop layer 133, forming via opening 165*b* as illustrated in FIG. 1F. The etching step for forming trenches 165*a* may be performed using a time-mode and may be stopped after the etching has been performed for a pre-set period of time. Other etch and stop point detection techniques, however, are also contemplated. In alternative embodiments, via opening 165*b* and trenches 165*a* are formed in separate photo lithography processes. For example, in a first photo lithography process, via opening 165*b* are formed to extend all the way down to etch stop layer 133. In a second lithography process, trenches 165*a* are formed to extend to an intermediate level of the dielectric layer 141. Etch stop layer 133 is then etched to expose the underlying metal capping layers 190 of the corresponding metal lines 135** in the $M_3$ layer.

In accordance with some embodiments of the present disclosure, the etching of the dielectric layer 141 is performed using a process gas comprising fluorine and carbon, wherein fluorine is used for etching, while carbon forms a polymer protecting the sidewalls of the resulting trenches **165*a* and via opening 165*b*. With an appropriate fluorine-to-carbon ratio, trenches 165*a* and via opening 165*b*** may have desirable profiles. For example, the process gases for the etching include a fluorine and carbon containing gas(es) such as $C_4F_8$ and/or $CF_4$ and a carrier gas such as $N_2$. In alternative embodiments, the process gases for the etching include $CH_2F_2$ and a carrier gas such as $N_2$.

Figure 1G:
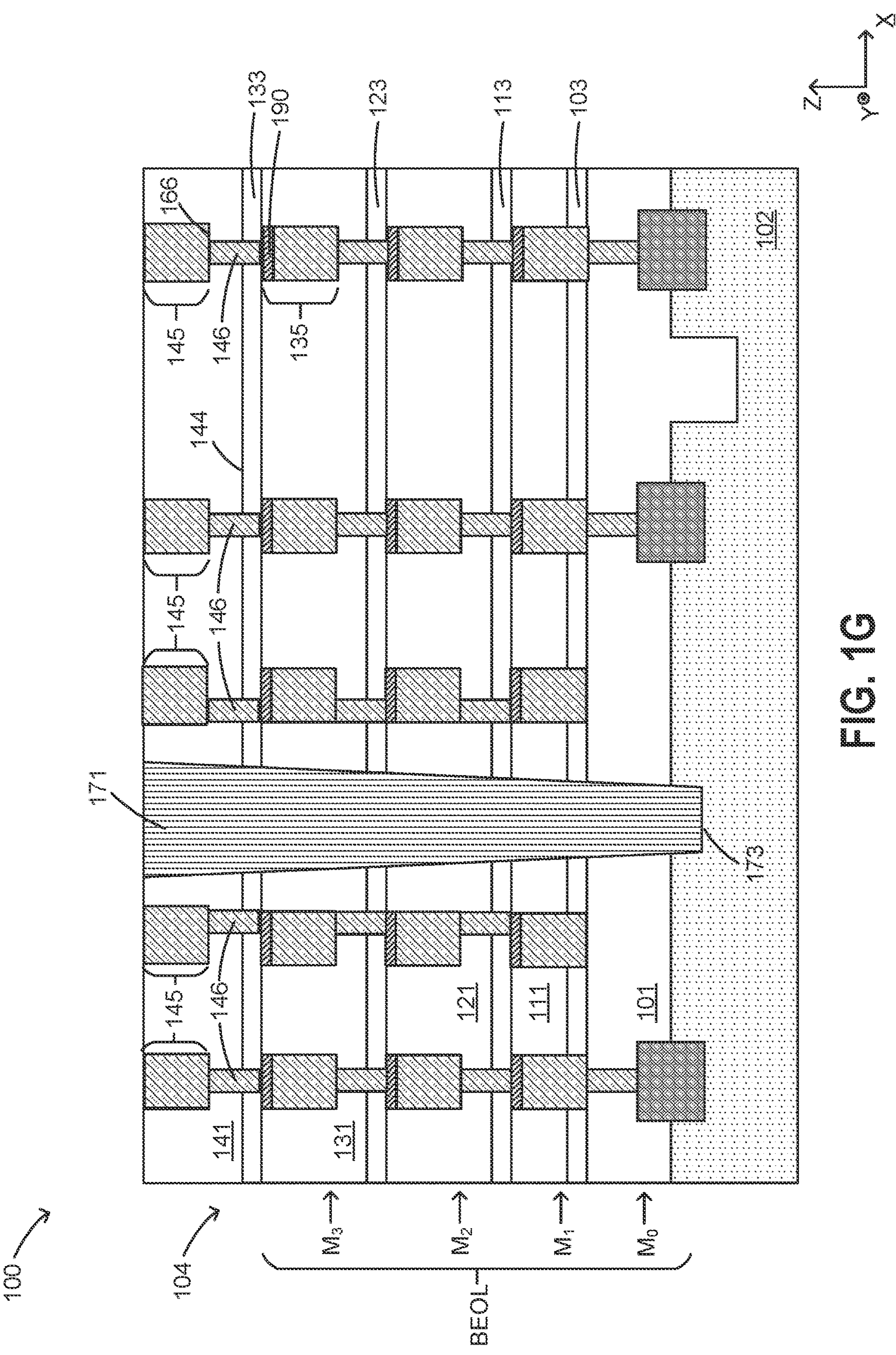

As illustrated in the example of FIGS. 1F-1G, a conductive material is deposited on the top surface 142 of the dielectric layer 141 to fill in the trenches **165*a* and via openings 165*b* and respectively form the metal lines 145 and metal vias 146. In some embodiments, the metal lines 145 and metal vias 146 may further include liners (not shown), such as diffusion barrier layers, adhesion layers, or the like. The liners may include titanium, titanium nitride, tantalum, tantalum nitride, or other alternatives. The inner material of metal lines 145 over liners is a conductive material such as copper, a copper alloy, nickel, gold, tungsten, aluminum, or the like. In some embodiments, the formation of metal lines 145 and metal vias 146 includes performing a blanket deposition to form a liner, depositing a thin seed layer of copper or copper alloy, and filling the rest of the trenches 165*a* and via openings 165*b* through, for example, electro-plating, electro-less plating, deposition, or the like. A CMP process may be performed to level the surface of metal lines and to remove excess material from the surface of the dielectric layer 141. It should be noted that the CMP process to planarize the metal lines 145 is performed prior to the formation of the metal capping layers on top of the metal lines 145, and the to-be-formed metal capping layers will not undergo the CMP process used to planarize the metal lines 145**.

Figure 1H:
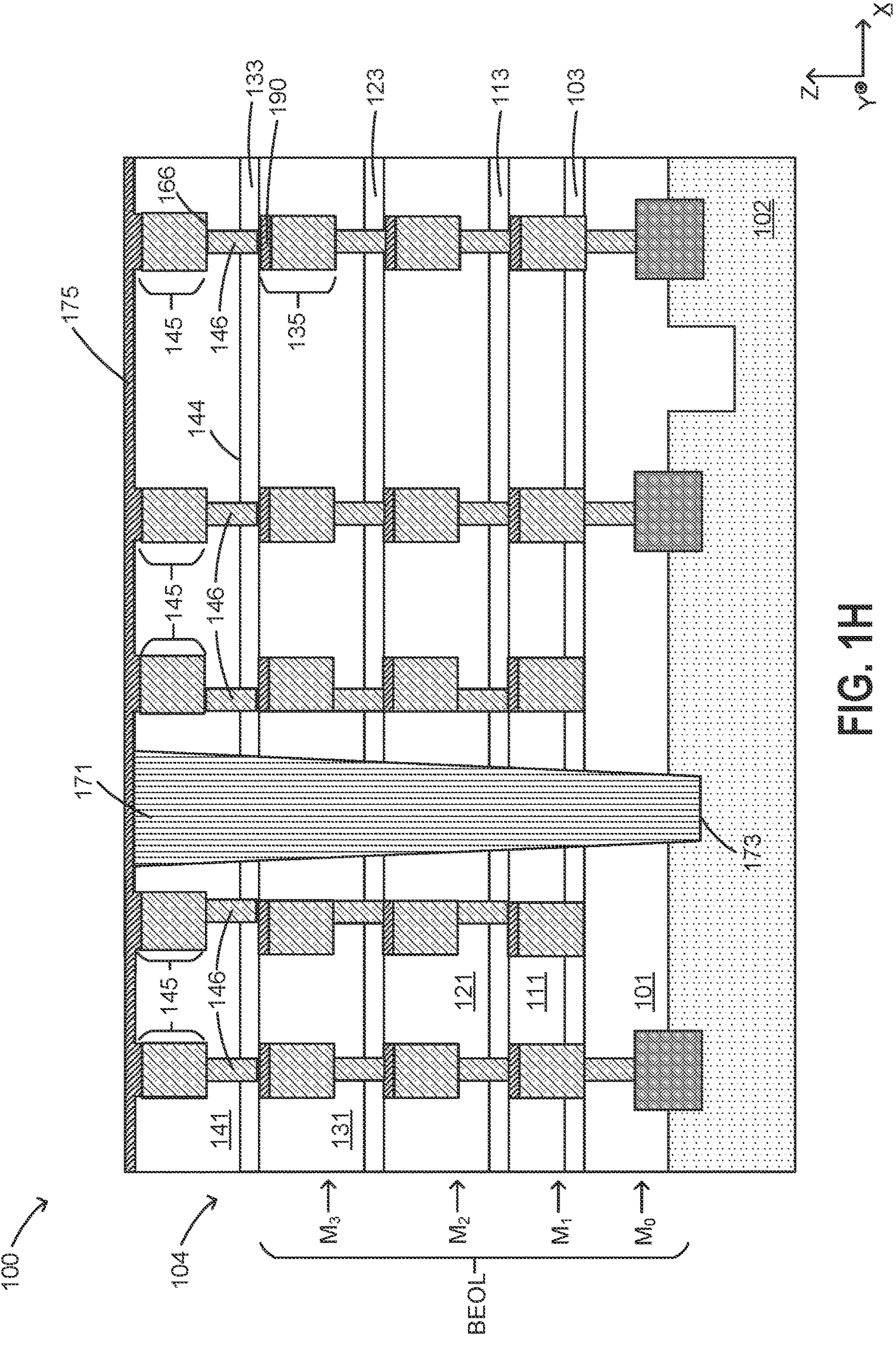
Figure 1I:
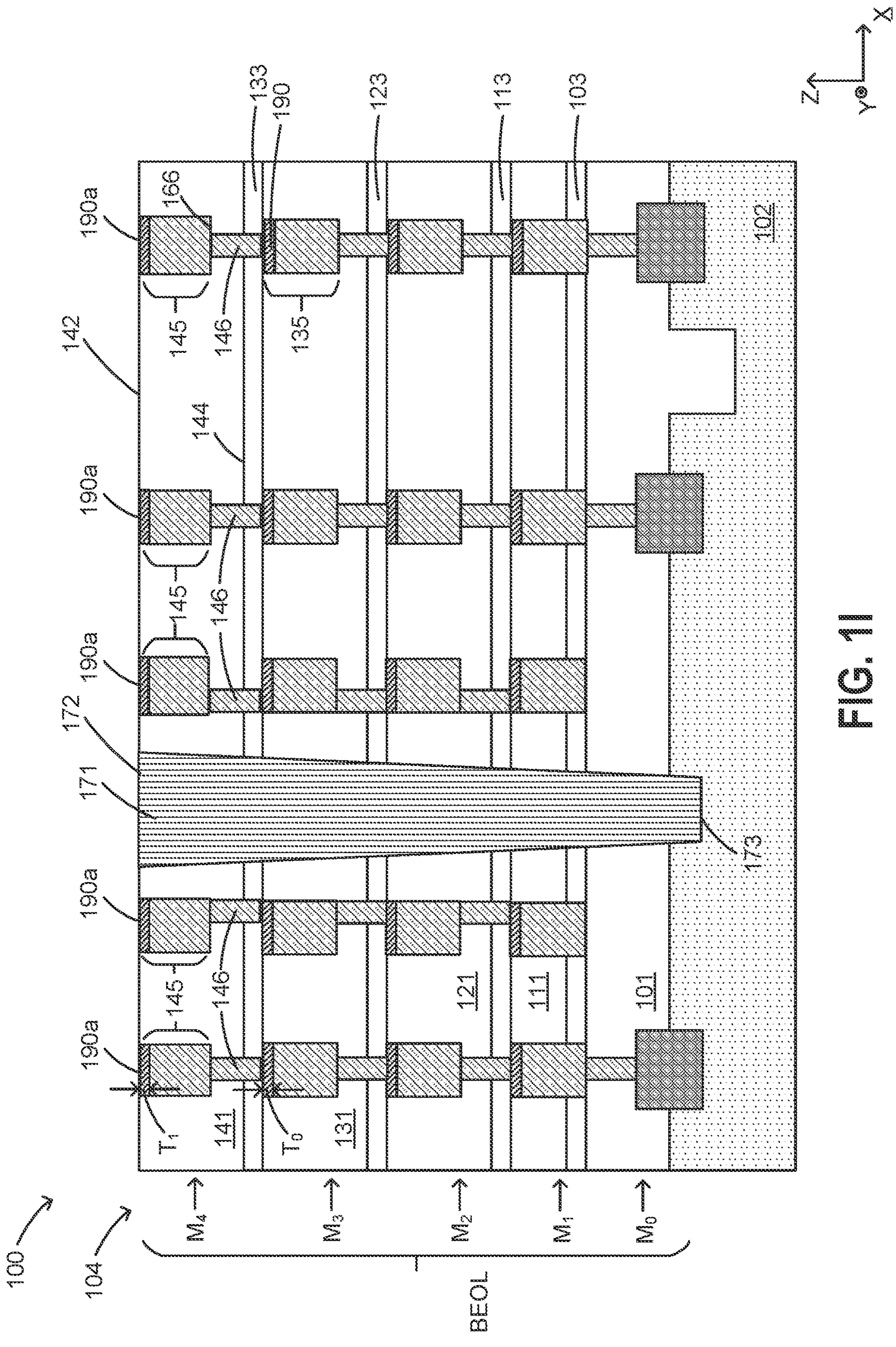

As illustrated in the example of FIGS. 1H-1I, metal capping layers **190*a* are formed over the metal lines 145. The capping material may be selected from the same group of candidate materials for forming metal capping layer 190 of FIG. 1A. Furthermore, Metal capping layers 190*a* may be formed using the same method for forming metal capping layers 190 in the non-TSV insert metallization layers (e.g., the $M_1$, $M_2$, and $M_3$ layers). In some embodiments, the metal capping layer 190*a* may be formed during the process of forming the metal lines 145 as described above, and there is no need for a separate process for forming the metal capping layer 190*a*. In some embodiments, a conductive layer 175 containing a capping material desired for forming the metal capping layers on the metal lines 145 is deposited on the top surface 142 of the dielectric layer 141 as well as the top surface of the metal lines 145. In alternative embodiments, a doping process is performed to dope a top portion of the metal lines 145 with a capping material and convert the top portion of the metal lines 145 into the metal capping layers 190*a***.

As illustrated in FIG. 1I, a second planarization process (e.g., a second CMP process) is performed to remove the excess conductive layer 175 and planarize the top surfaces of the metal capping layers **190*a*. The metal capping layers 190*a* are formed as a top portion of the corresponding metal lines 145. The finished metal lines 145 and metal vias 146 as well as the dielectric layer 141 form the $M_4$ layer (i.e., the TSV insert metallization layer) after the TSV 171** is formed.

The second planarization process may be a second CMP process similar to the CMP process for forming the metallization layers 190 in the non-TSV insert metallization layers (i.e., the $M_1$, $M_2$, and $M_3$ layers). After the second process, the metal capping layers **190*a* are planarized any leveled with TSV 171 at the top surface 142 of the dielectric layer 141**.

It is important to note that the metal capping layers **190*a* in the TSV insert metallization layer (i.e., $M_4$ layer) are formed by performing only one CMP process (i.e., the second CMP process), and is not treated by the first CMP process for forming the TSV 171 as shown in FIG. 1E. As a comparison, if the TSV 171 is formed after formation of the $M_4$ layer (i.e., the metal lines 145, metal vias 146, and the metal capping layers 190*a*), the metal capping layers 190*a* would be treated by both the first CMP process and the second CMP process (i.e., double CMP treatments) and may be substantially or entirely removed after the two CMP treatments. Therefore, implementation of the present method advantageously allows formation the TSV prior to forming the metal lines in the TSV insert metallization layer and avoids double CMP treatments to the metal capping layers of the metal lines in the TSV insert metallization layer. Importantly, the avoidance of double CMP treatments can effectively prevent the damage or removal of the metal capping layers and improve the overall resistance to the electromigration of the semiconductor structure 100**.

In some embodiments, the metal capping layers 190*a* in the TSV insert metallization layer (i.e., the $M_4$ layer of FIG. 1I) may have a thickness $T_1$. $T_1$ may be the same or substantially the same with $T_0$ of the metal capping layers 190 in the non-TSV meta layers (i.e., $M_1$, $M_2$, and $M_3$ layers of FIG. 1I). In some embodiments, the deviation of $T_1$ relative to $T_0$ is no more than 50%, no more than 30%, no more than 20%, no more than 10%, no more than 7%, no more than 5%, no more than 3%, or no more than 1%. The thickness of the metal capping layer may be measured using Energy Dispersive X-ray spectroscopy (EDX) techniques targeting the capping element (e.g., Mn or Co) in a given material. Based on the concentration and distribution of the capping element, the thickness of the metal capping layer can be calculated. In some embodiments, the overall thickness of the metal capping layers 190 and 190*a* in the MLI structure 104 may be essentially or substantially uniform, with a deviation of no more than 50%, no more than 30%, no more than 20%, no more than 10%, no more than 7%, no more than 5%, no more than 3%, or no more than 1%.

Figure 1J:
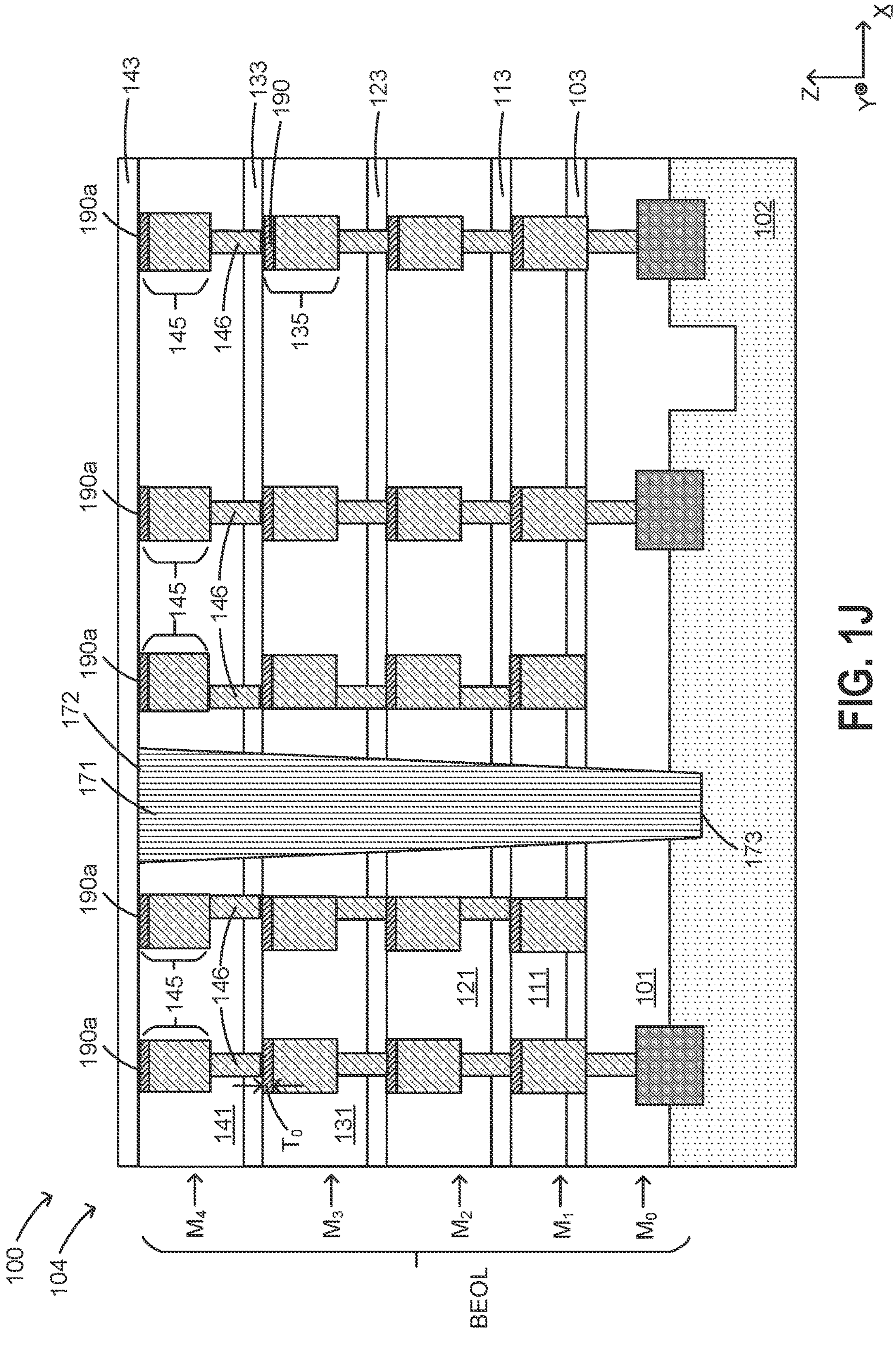

In the illustrated example of FIG. 1J, an etch stop layer 143 is deposited on the top surface 142 of the dielectric layer 141 as well as the top surfaces of the TSV 171 and the metal capping layers 190*a*. The etch stop layer 143 may be similar to other etch stop layers 103, 113, 123, and 133 with respect to the composition and process of formation.

Figure 1K:
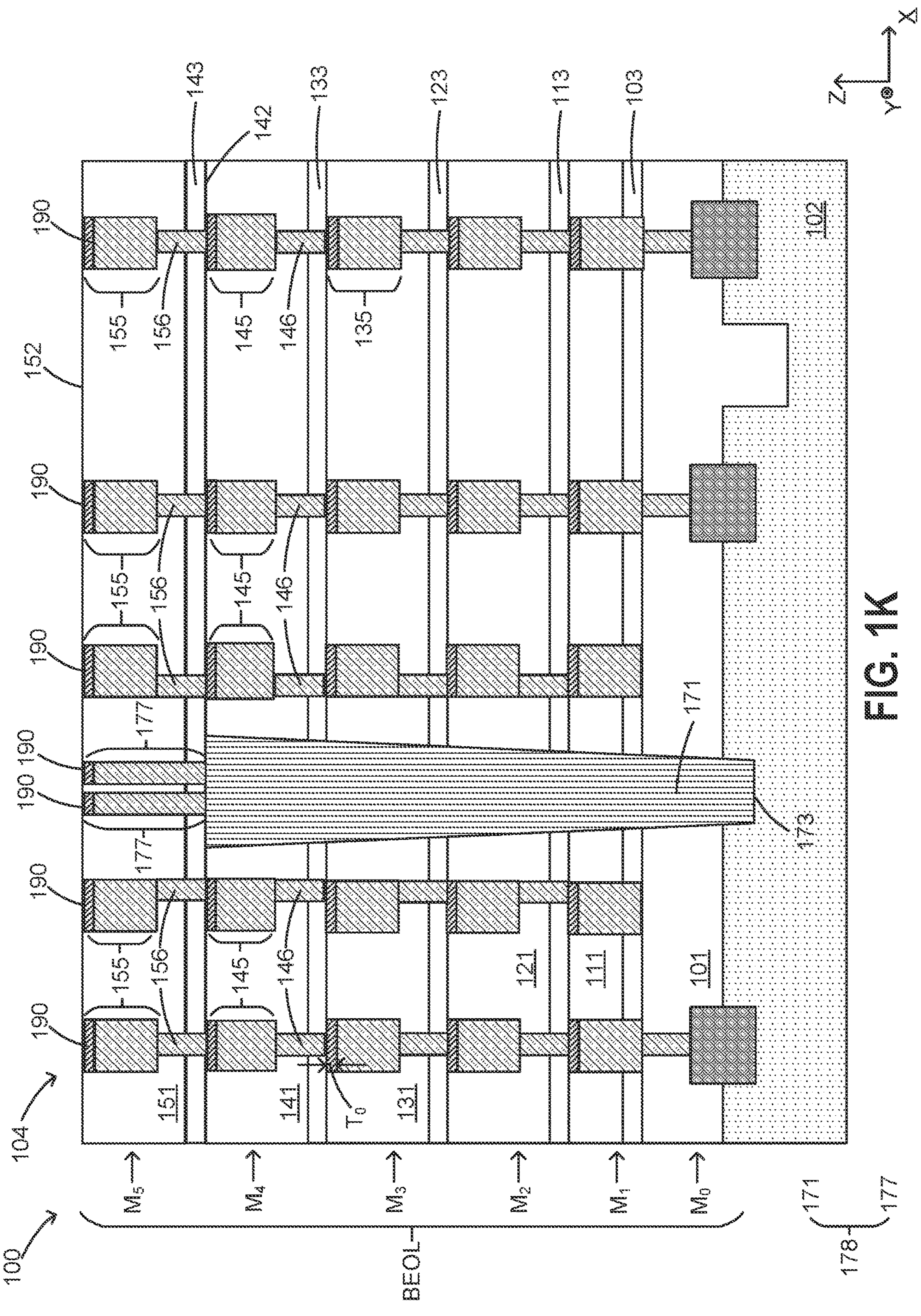
Figure 1L:
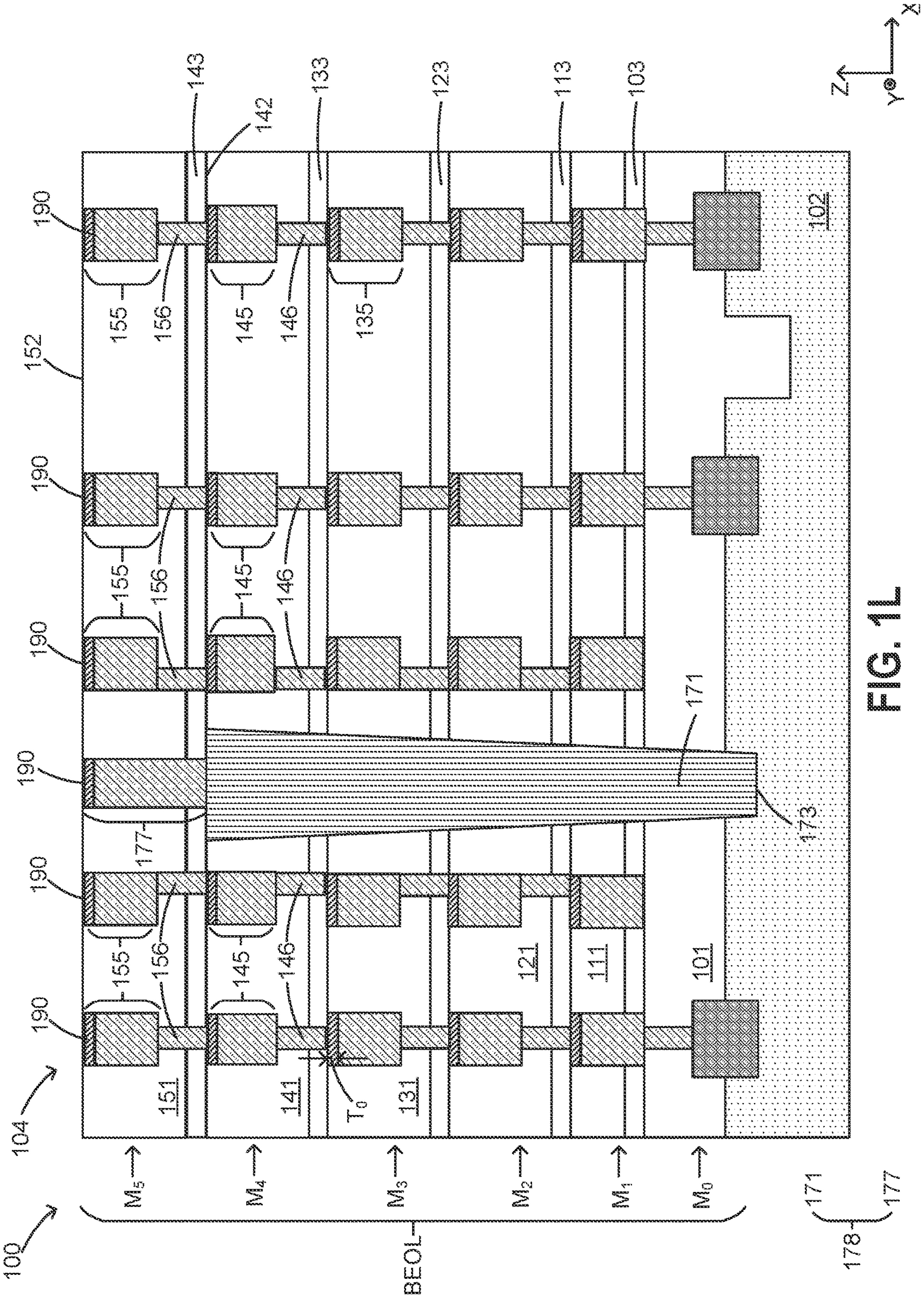

FIGS. 1J-1L illustrate formation of upper features over the TSV insert metallization layer (i.e., the $M_4$ layer of FIG. 1I). For example, one or more additional metallization layers may be formed over the $M_4$ layer. In some embodiments, an $M_5$ layer next to and above the $M_4$ layer (i.e., the TSV insert metallization layer) may be formed. The $M_5$ layer may be a non-TSV insert metallization layer and may be formed using the similar processes to the formation of $M_1$, $M_2$, and $M_3$ layers in FIG. 1A. In some embodiments, the $M_5$ layer includes multiple metal lines 155 with metal capping layers 190 as well as the metal vias 156 connecting the metal lines 155 in the $M_5$ layer and the corresponding metal lines 145 in the $M_4$ layer. More additional metallization layers (e.g., $M_6$ layer, $M_7$ layer, etc.) may be formed sequentially over the $M_5$ layer, and additional TSV connectors may be respectively formed in each of the additional metallization layers to connect the TSV 171 to the top surface of the semiconductor structure 100.

In some embodiments, one or more TSVs 177 are also formed in the $M_5$ layer. The TSV connector 177 electrically connects the TSV 171 to a conductive feature above the $M_5$ layer. The TSV connector 177 may also include a metal capping layer 190 in a top portion of the TSV connector 177, in a similar manner as the metal lines 155. The TSV connector 177 and the metal lines 155 may be formed in the same process. In some embodiments, the top surface of the TSV connector 177 and the metal lines 155 are aligned and leveled at the same surface (i.e., the top surface 152 of the dielectric layer 151). The TSV connector 177 and the TSV 171 may be viewed as constituents of a TSV structure 178. The TSV structure 178 may further include TSV connectors formed in the additional metallization layers above the $M_5$ layer.

It should be noted that the number, shape, dimension, profile, and arrangement of the TSV connector 177 may vary depending on design requirements. In the example of FIG. 1K, two relatively small TSV connectors 177 are formed. In the example of FIG. 1L, one relatively large TSV connector 177 is formed.

Figures 1M, 1N, 1O, 1P, 1Q:
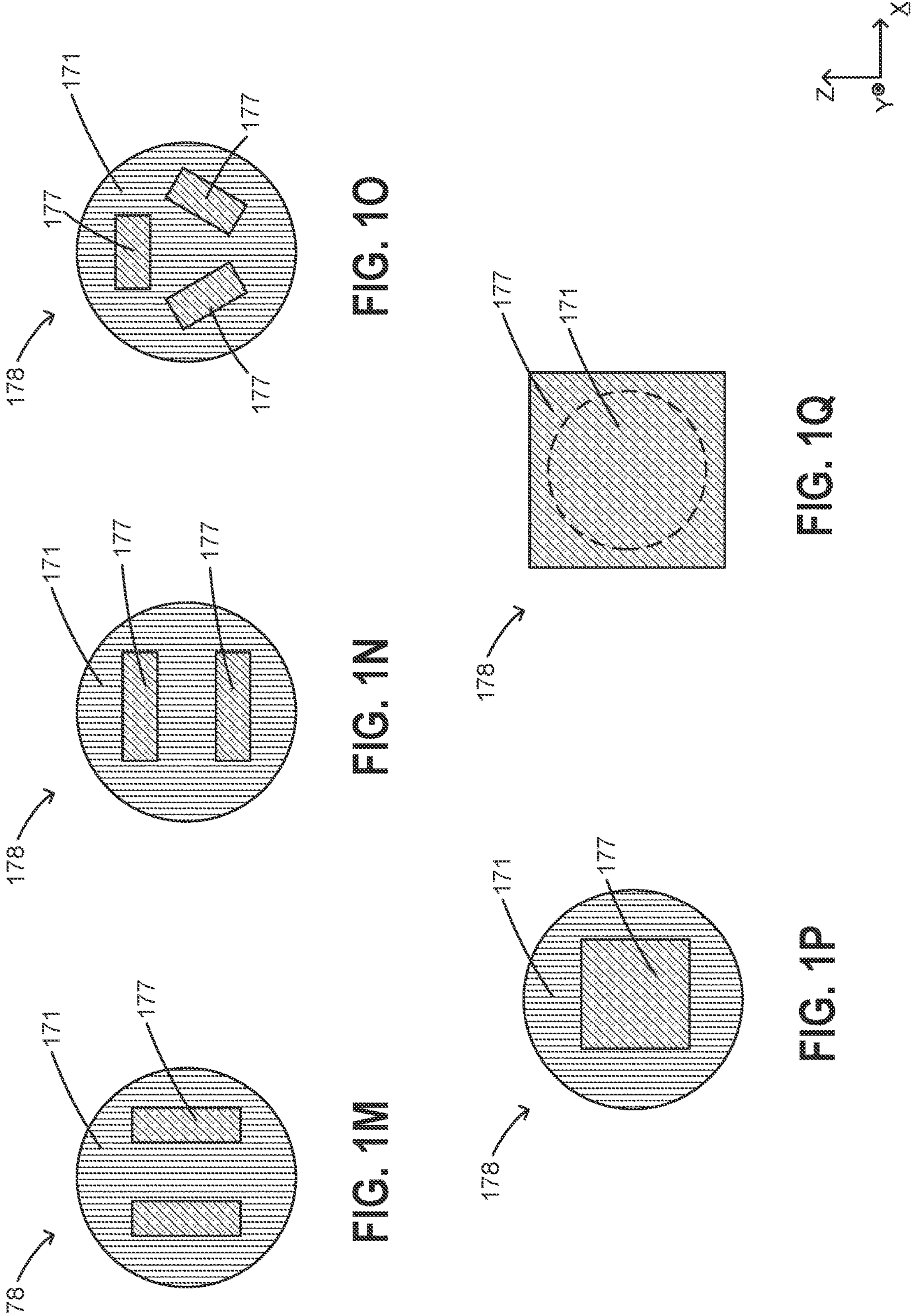
FIGS. 1M-1Q schematically illustrate top views of example TSV structures, in accordance with some embodiments.

FIGS. 1M-1Q are top views illustrating various examples of the TSV structure 178. As shown in FIGS. 1M-1O, the TSV structure 178 may include two or more TSV connectors 177 disposed on the TSV 171. The TSV 171 may have a circular shape in the horizontal plane (i.e., the X-Y plane), and the TSV connectors 177 may have a rectangular or square shape and a smaller horizontal dimension relative to the TSV 171. The position and arrangement of TSV connectors 177 on the TSV 171 may also vary. As shown in FIGS. 1P and 1Q, the TSV structure 178 may each have a single TSV connector 177 that has a relatively large horizontal dimension. As shown in FIG. 1Q, the TSV connector 177 may be larger than the TSV 171 with respect to the horizontal dimension, such that the TSV connector 177 covers the top surface of the TSV 171. It should be noted that the examples illustrated in FIGS. 1M-1Q are not intended to be limiting, and other configurations of the TSV structure 178 are also within the scope of the present disclosure.

The semiconductor structure 100 shown in FIGS. 1E-1L may be used in a subsequent wafer packaging process such as die bonding and staking process to fabricate die stack structures and package structures. Additional components such as bonding layers, connectors, and bonding structures may be formed on the semiconductor structure 100 for subsequent packaging process. Examples of package structures are described below with references to FIG. 3.

FIGS. 2A-2F are schematic diagrams illustrating cross-sectional views of intermediate stages in the formation of another example of the semiconductor structure 200, in accordance with some embodiments. The operations shown in FIGS. 2A-2F are also illustrated schematically in method 500 of FIG. 5. In the subsequent discussion, the operations shown in FIGS. 2A-2F are also discussed referring to the operations in FIG. 5. The semiconductor structure 200 is a close variation of the semiconductor structure 100 of FIG. 1A-1L, and similar materials of each component and similar operations of each process for forming the semiconductor structure 200 will not be repeated unless otherwise indicated.

Figure 2A:
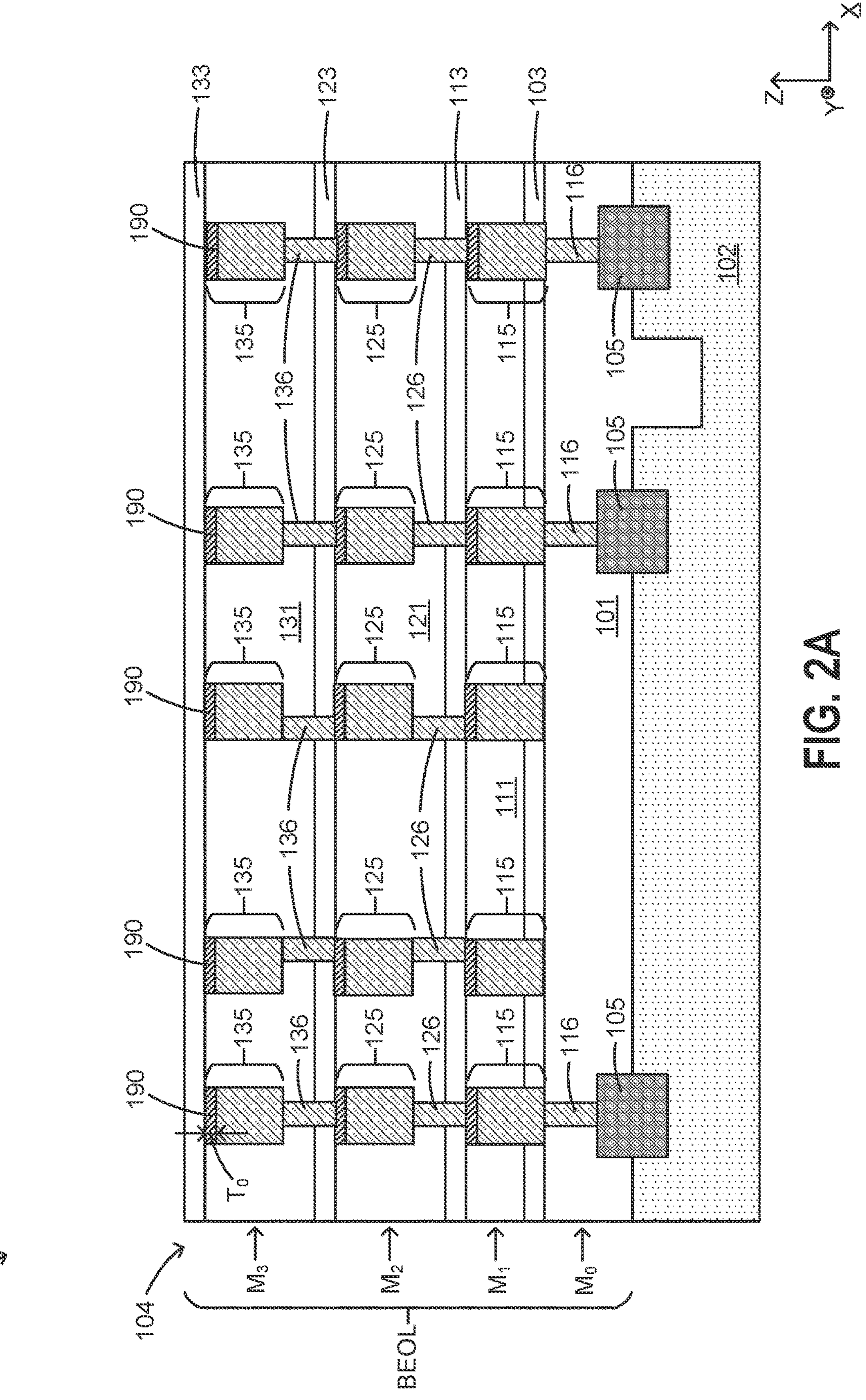
FIGS. 2A-2F schematically illustrate cross-sectional views of intermediate stages in the formation of another example semiconductor structure, in accordance with some embodiments.
Figure 2B:
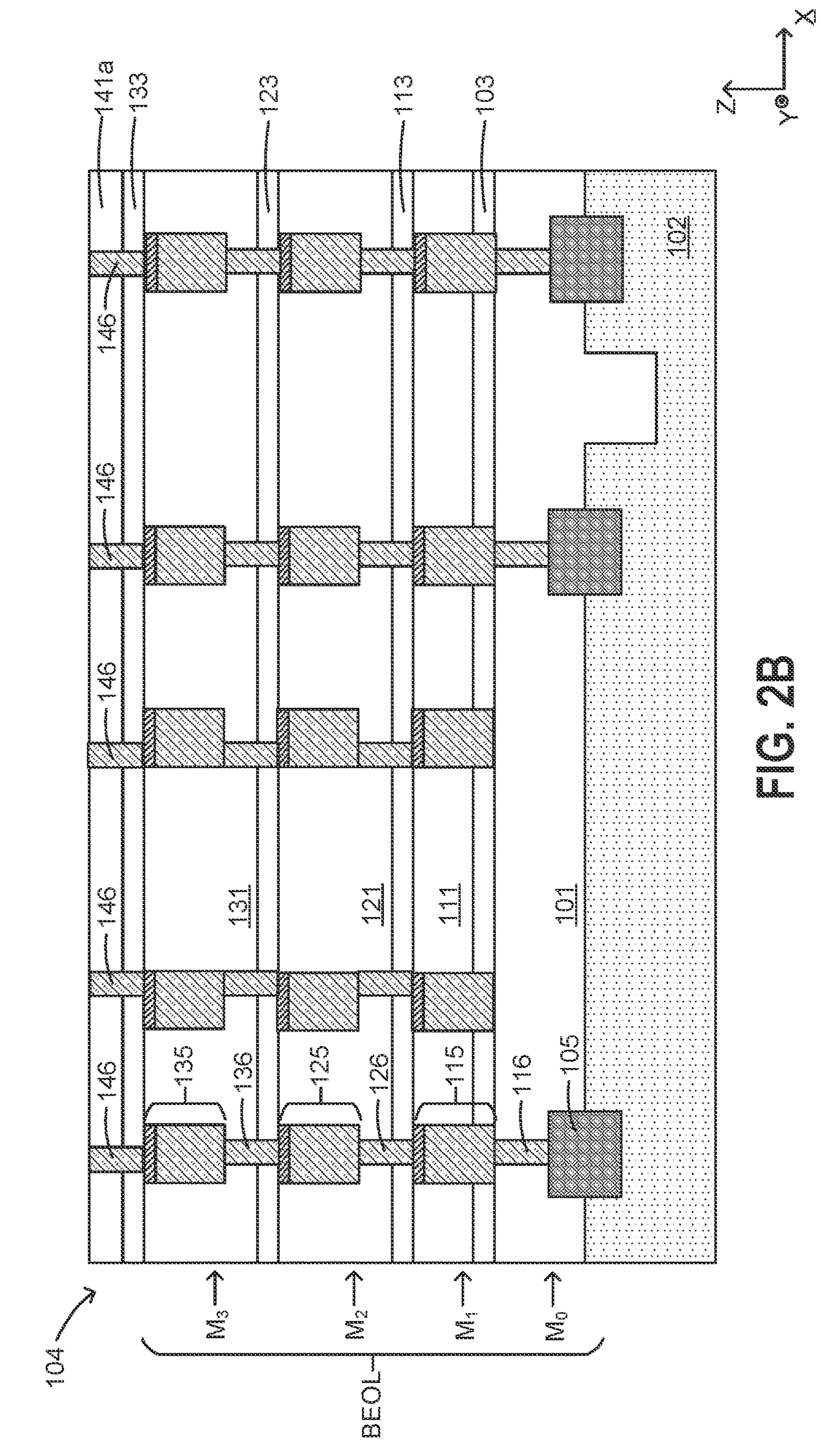

As illustrated in FIG. 2A, a semiconductor structure 200 is formed or provided. The semiconductor structure 200 is the same as the semiconductor structure 100 of FIG. 1A. As illustrated in FIG. 2B, a dielectric layer 141*a* is formed on the etch stop layer 133, and multiple metal vias 146 are formed in the dielectric layer 141*a* and the etch stop layer 133. The metal vias 146 may be formed by a single damascene process. In some embodiments, via openings (not shown) are formed through the dielectric layer 141*a* and the etch stop layer 133 to expose the top surface of the underlying metal capping layer 190 of the corresponding metal lines 135 in the $M_3$ layer. A conductive layer is formed on the dielectric layer 141*a* and fill the via openings, and a planarization process (e.g., a CMP process) is performed to form the metal vias 146 having substantially planar and uniform top surfaces.

Figure 2C:
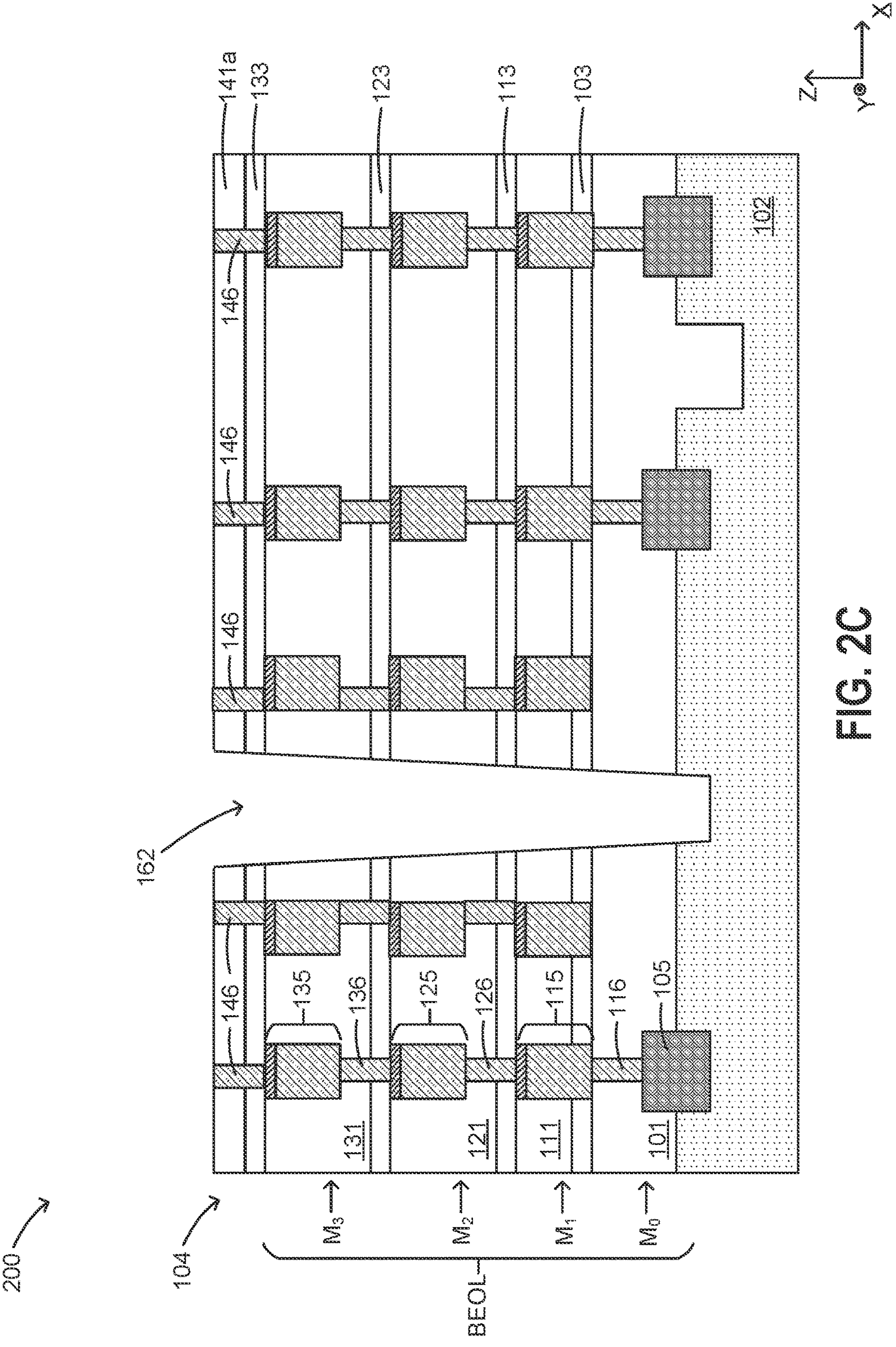
Figure 2D:
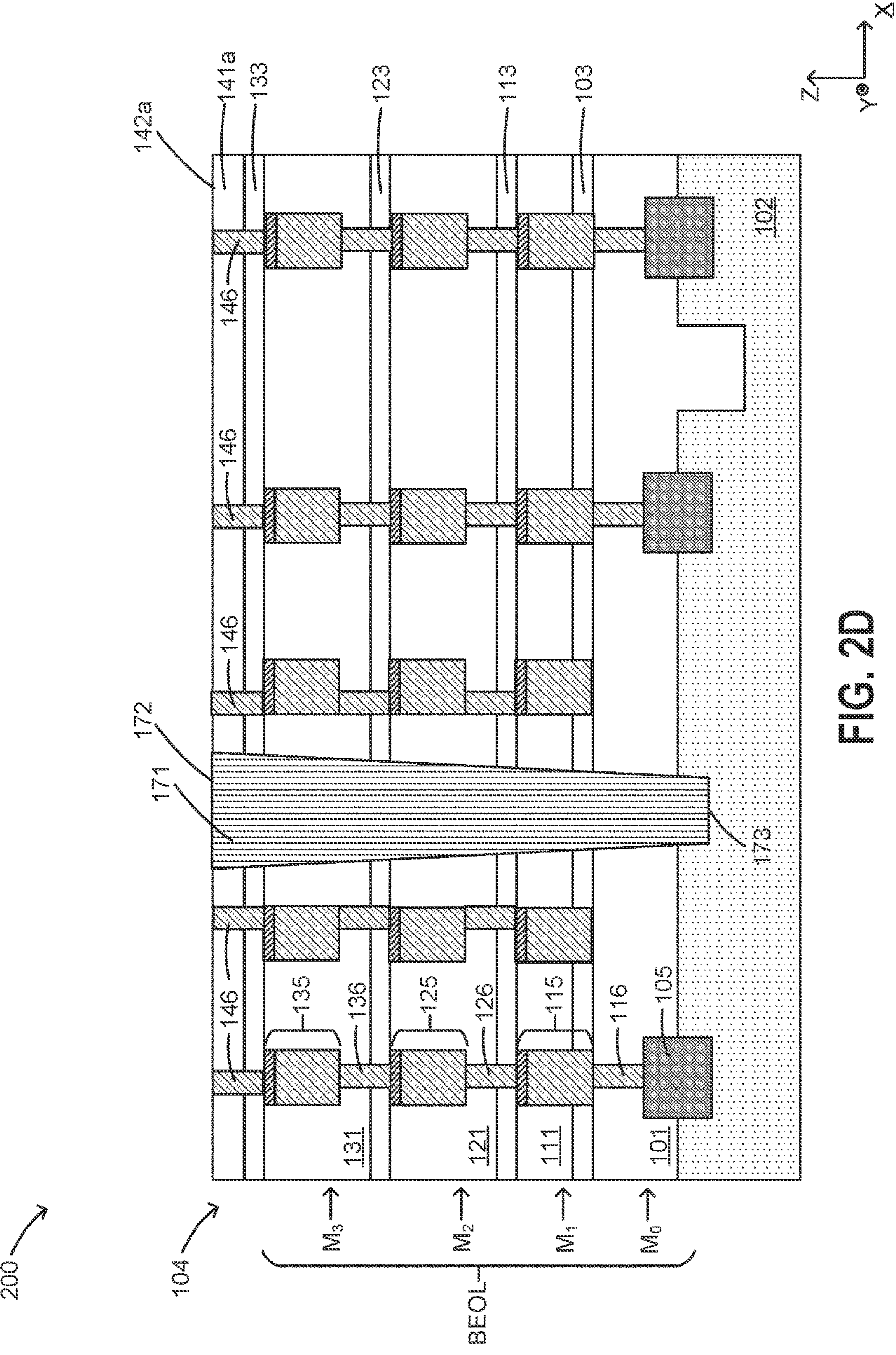

As illustrated in FIG. 2C, a TSV opening 162 is formed, in a similar manner as the formation of the TSV opening 162 shown in FIG. 1C. As illustrated in FIG. 2D, a TSV 171 is formed, in a similar manner as the formation of the TSV 171 shown in FIG. 1E. The TSV extends from a top surface 172 to a bottom surface 173. The top surface 172 is substantially planar and leveled with the top surfaces of the metal vias 146 at the top surface 142*a* of the dielectric layer 141*a*. The bottom surface 173 is at an intermediate level of the substrate 102.

Figure 2E:
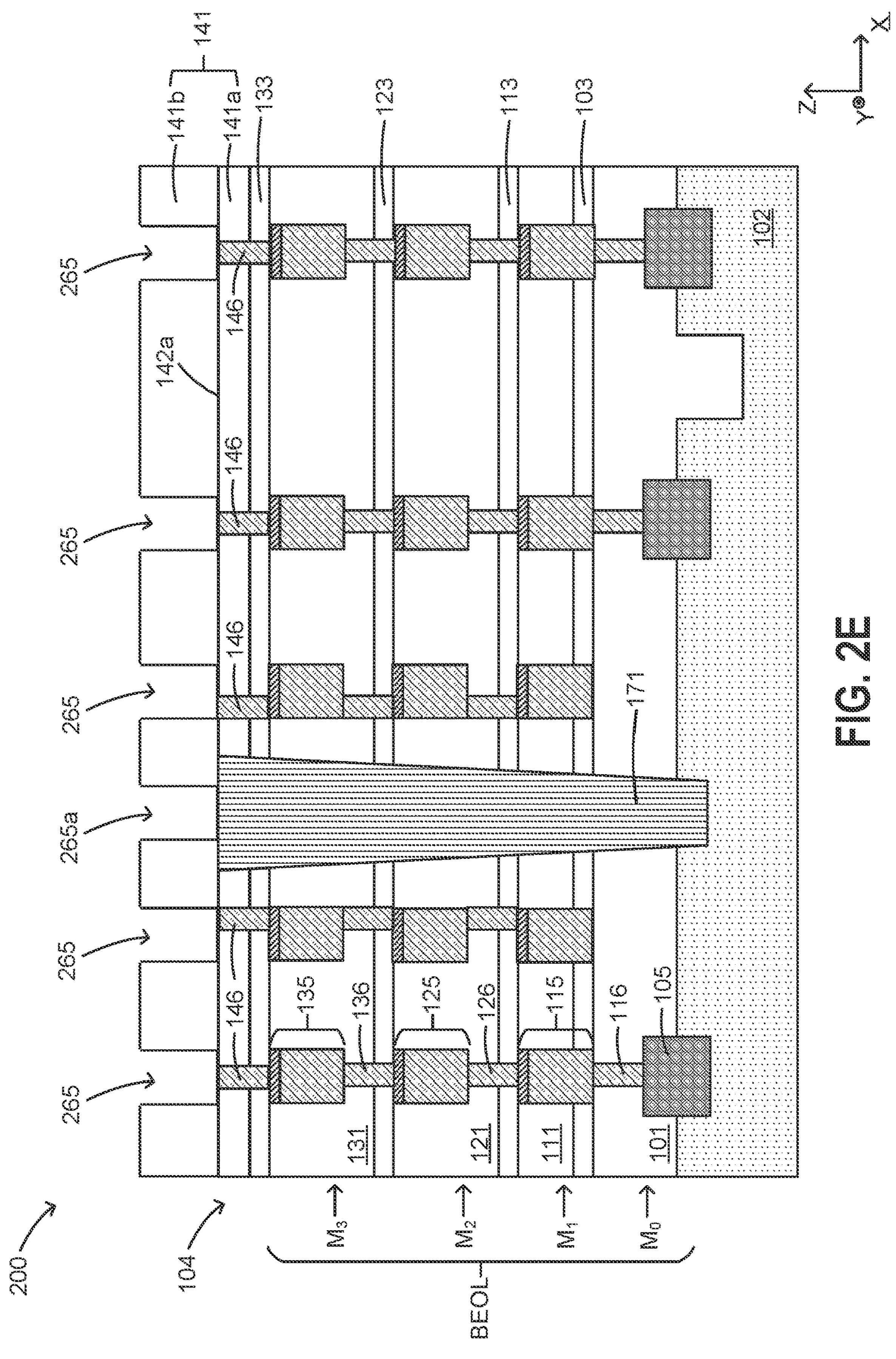

As illustrated in FIG. 2E, a dielectric layer 141*b* is formed on the top surface 142*a* of the dielectric layer 141*a*, and multiple openings 265 and 265*a* are formed in the dielectric layer 141*b*. The multiple openings 265 are respectively formed over the metal vias 146 as well as the TSV 171 to expose a top surface of each of the metal vias 146 and the TSV 171. The openings 265 over the metal vias 146 are configured to accommodate to-be-formed metal lines, and the opening 265*a* over the TSV 171 is configured to accommodate a to-be-formed TSV connector. The dielectric layers 141*a* and 141*b* can be viewed as a combined dielectric layer 141, and the top surface 142*a* can be viewed as an interface between the dielectric layers 141*a* and 141*b*.

Figure 2F:
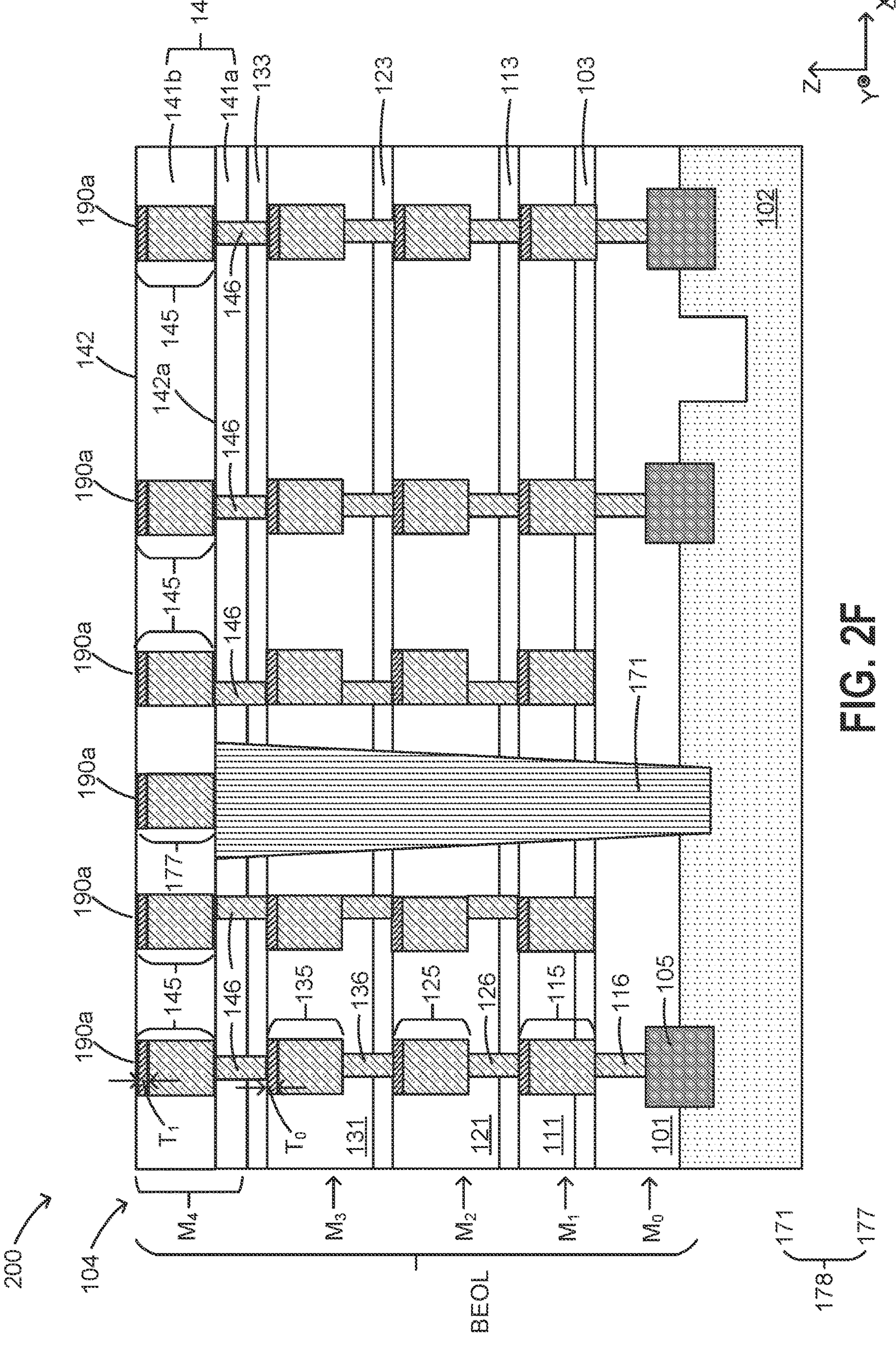

As illustrated in FIG. 2F, multiple metal lines 145 and a TSV connector 177 are formed, in a similar manner as the example shown in FIGS. 1I-1L. Each of the metal lines 145 and the TSV connector 177 also includes a metal capping layer 190*a* in a top portion thereof. The metal lines 145 in the dielectric layer 141*b* are respectively connected to the underlying metal vias 146 in the dielectric layer 141*a*, thereby forming the TSV-insert layer (i.e., $M_4$ layer) over the $M_3$ layer. The TSV connector 177 and the underlying TSV 171 are electrically connected to each other and form a TSV structure 178. The TSV structure 178 of FIG. 2F may have various configurations, in a similar manner as the examples of FIGS. 1M-1Q.

In the semiconductor structure 200 shown in FIG. 2F, the TSV 171 is formed after the formation of the metal vias 146, but prior to the formation of the metal lines 145. Thus, TSV 171 is still considered as being formed prior to the completion of the $M_4$ layer. The top surface 142 of the first dielectric layer 141*a* can be viewed as an interface between the dielectric layers 141*a* and 141*b* and can be further viewed as an intermediate level of the combined dielectric layer 141. Because the top surface 172 of the TSV 171 is leveled with the top surface 142*a*, the TSV 171 can be considered as initiated in an intermediate level of the $M_4$ layer. Therefore, the $M_4$ layer can be viewed as a TSV insert metallization layer, in a similar manner as the example shown in FIG. 1I. For the same reasons as described above, because the metal lines 145 are formed after the formation of the TSV 171, the metal capping layers 190*a* of the metal lines 145 are formed through only one CMP process to planarize the top surface of the metal capping layers 190*a* and are not treated by the CMP process for forming the TSV 171. Thus, double CMP treatment to the metal capping layers 190*a* is avoided. The metal capping layers 190*a* may have a thickness ($T_1$) essentially the same as the thickness ($T_0$) of the non-TSV insert metallization layers (i.e., $M_1$, $M_2$, and $M_3$ layers), in a similar manner as the examples shown in FIGS. 1K and 1L.

Figure 3:
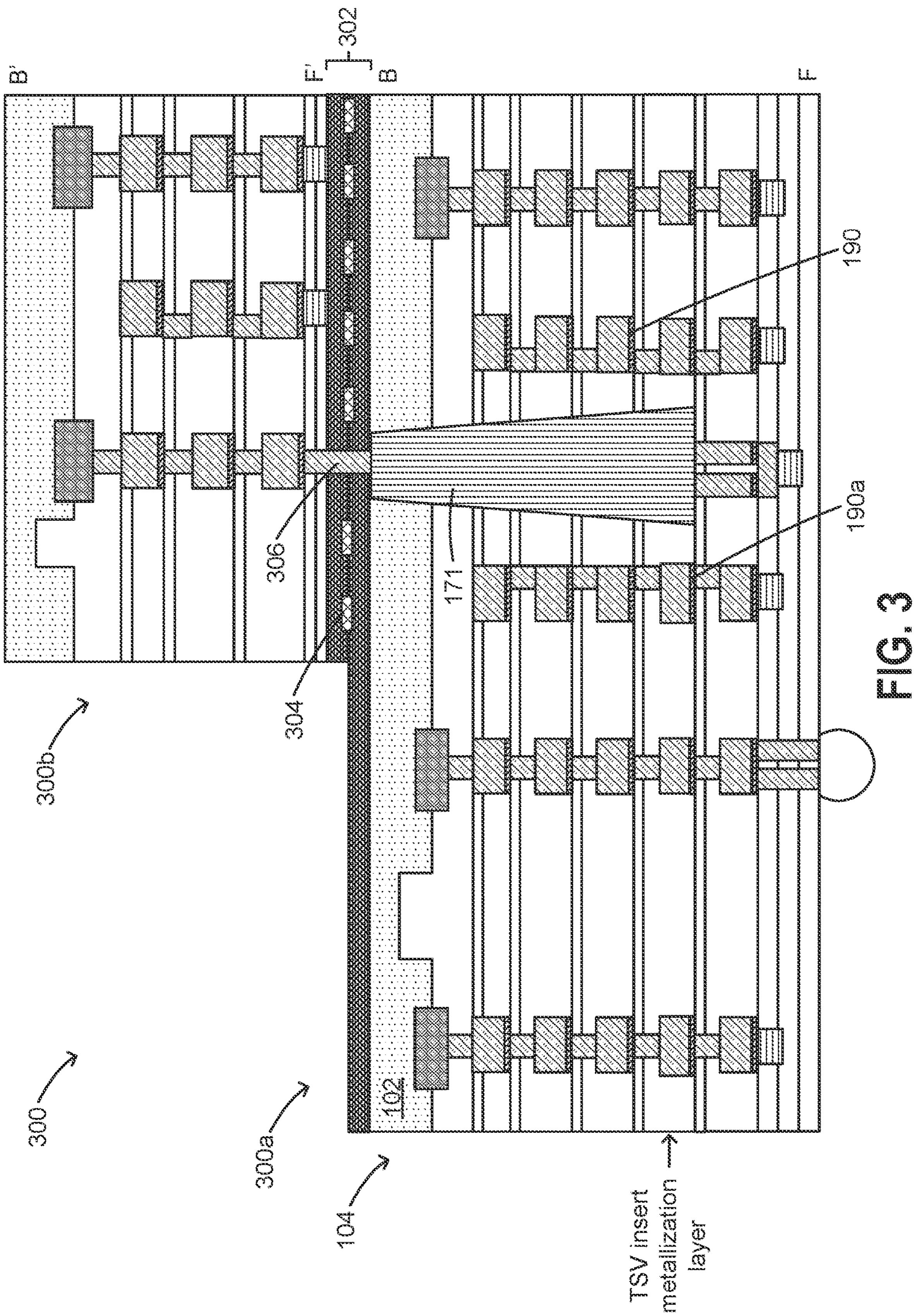
FIG. 3 schematically illustrates a cross-sectional view of an example of a die stack structure, in accordance with some embodiments.

FIG. 3 illustrates a cross-sectional view of an example die stack structure 300 according to some embodiments. In the illustrated example, the die stack structure 300 includes, among other components, a first die 300*a* and a second die 300*b*. The first die 300*a* may be any one of the semiconductor structures 100 and 200 shown in FIGS. 1A-1K and FIGS. 2A-2F. The second die 300*b* may be similar to the first die 300*a*. The first die 300*a* has a front side (F) and a back side (B), and the second die 300*b* has a front side (F') and a back side (B'). The first die 300*a* and the second die 300*b* are bonded in a front-to-back manner (i.e., F'-to-B) at a bonding region 302. The first die 300*a* and the second die 300*b* may be bonded through conductive bonding, fusion bonding, or hybrid bonding. In some embodiments, multiple bonding connectors 304 are formed in the bonding region 302 to bond the first die 300*a* and the second die 300*b*.

In the illustrated example, the first die 300*a* includes an MLI structure 104 formed on a substrate 102, and a TSV 171 extending from a TSV insert metallization layer through the MLI structure 104 below the TSV insert metallization layer and the underlying substrate 102. The TSV 171 is connected to a metal line of the second die 300*b* through one or more conductive connectors 306. As described above, the metal lines as well as the TSV connectors in the TSV insert metallization layer have a metal capping layer 190*a* with substantially the same thickness as compared to other metal lines in the non-TSV insert metallization layers. Thus, the overall performance of electromigration resistance of the die stack structure 300 can be improved.

It should be noted that the example die stack structure 300 illustrated in FIG. 3 is not intended to be limiting, and other die stack structures such as face-to-face die stack structures, back-to-back die stack structures, and so on. Additionally, other package structures are also within the scope of the present disclosure, including but not limited to quad flat pack (QFP), pin grid array (PGA), ball grid array (BGA), flip chips (FC), three-dimensional integrated circuits (3DICs), wafer level packages (WLPs), and package on package (POP) devices. Further, the semiconductor structures and methods according to the present disclosure may also be generally applicable in semiconductor fabrication processes involving the formation of a TSV in an MLI structure.

Figure 4:
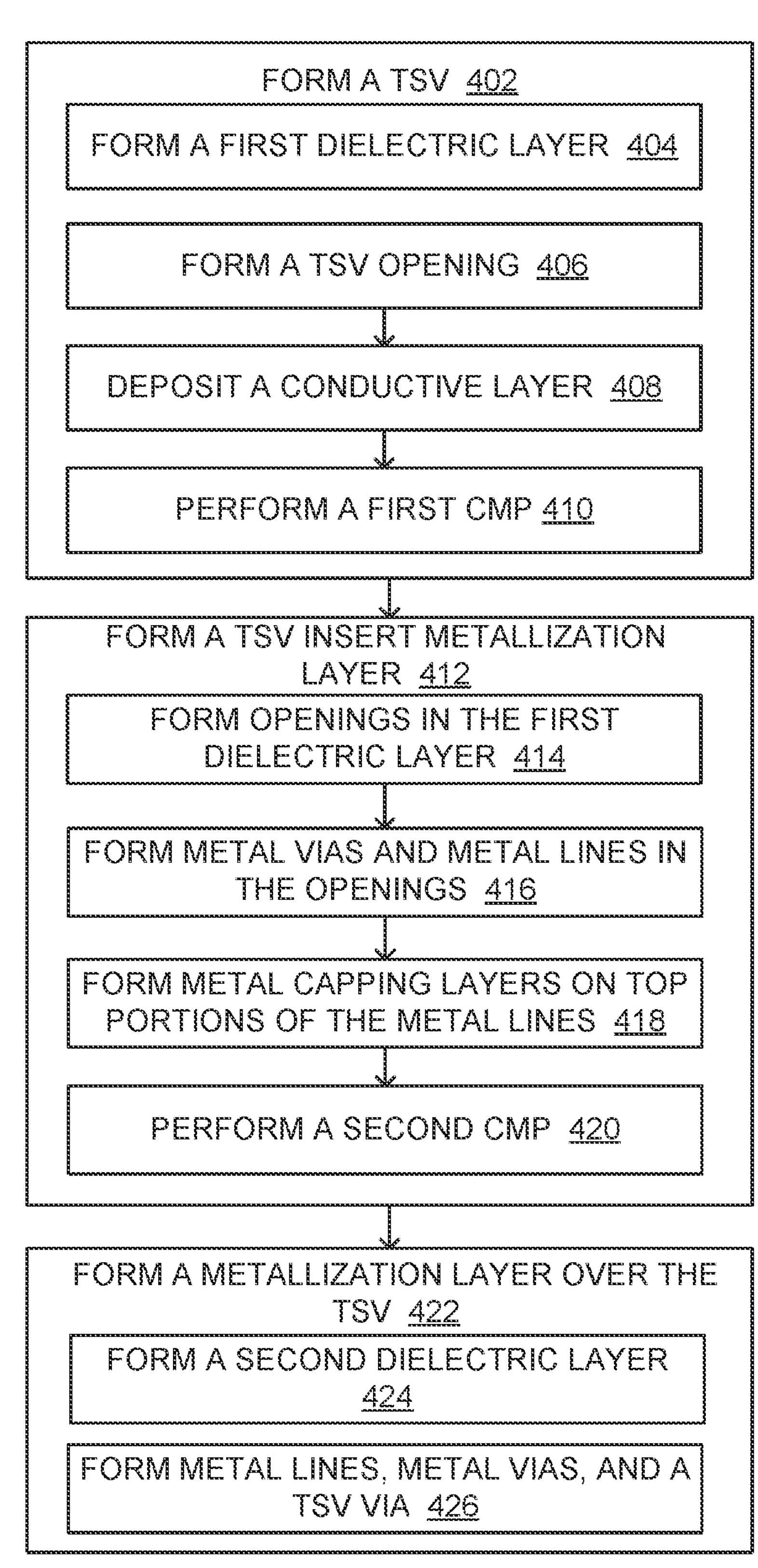
FIG. 4 is a flow chart illustrating an example method for forming a semiconductor structure, in accordance with some embodiments.

FIG. 4 is a flow diagram illustrating a method 400 for forming a semiconductor structure having a TSV structure according to some embodiments. As described above, the cross-sectional views of the examples shown in FIGS. 1A-1L are also illustrative for operations of the method 400. In the example shown in FIG. 4, the method 400 includes operations 402, 404, 406, 408, 410, 412, 414, 416, 418, 420, 422, 424, and 426. Additional operations may be performed. Also, it should be understood that the sequence of the various operations discussed above with reference to FIG. 4 is provided for illustrative purposes, and as such, other embodiments may utilize different sequences. These various sequences of operations are to be included within the scope of embodiments.

At 402, a TSV is formed in a provided semiconductor structure. The provided semiconductor structure includes a substrate and an MLI structure on the substrate, and the MLI structure includes multiple metallization layers denoted as $M_i$ layers, wherein i=0, 1, . . . N, N is an integer, and N>1. The $M_N$ layer is the topmost metallization layer. The $M_i$ layers (i=0, 1, . . . N) may be non-TSV insert metallization layers.

Operation 402 may further include operations 404, 406, 408, and 410. At 404, a first dielectric layer is formed. In some embodiments, a first etch stop layer is formed on the topmost metallization layer $M_N$ layer, and the first dielectric layer is formed on the first etch stop layer. At 406, a TSV opening is formed. The TSV opening may be formed by using a patterning and etching process. The TSV opening extends through the first dielectric layer, the first etch stop layer, and the MLI structure to an intermediate level of the substrate. At 408, a metallization layer containing a conductive material is deposited and the TSV opening is filled with the conductive material. At 410, a first CMP is performed to form a TSV and planarize a top surface of the TSV.

At 412, a TSV insert metallization layer is formed. The TSV insert metallization layer is formed based on the first dielectric layer (e.g., where the TSV is initiated), and the TSV insert metallization layer is the $M_{N+1}$ layer, which is next to and above the topmost $M_N$ layer. In some embodiments, operation 412 further includes operations 414, 416, 418, and 420. At 414, trenches and openings are formed in the first dielectric layer to receive and accommodate to-be-formed metal lines and metal vias. At 416, metal lines and metal vias are formed in the trenches and openings. At 418, metal capping layers are formed on the metal lines or in a top portion of the metal lines. At 420, a second CMP process is performed to planarize the metal capping layers on the metal lines. The TSV insert metallization layer is formed after the TSV is formed, thus the metal capping layers only undergo one CMP treatment (i.e., the second CMP process). In some embodiments, the metal capping layers included in the TSV insert metallization layer have a thickness substantially the same as the thickness of the metal capping layers included in the non-TSV insert metallization layers, with a deviation of no more than 10%.

At 422, an additional metallization layer over the TSV is formed. The metallization layer formed on and above the TSV is denoted as $M_{N+2}$ layer. In some embodiments, operation 422 further includes operations 424 and 426. At 424, a second dielectric layer is formed. In some embodiments, a second etch stop layer is formed on the TSV insert metallization layer, and the second dielectric layer is formed on the TSV insert metallization layer. At 426, metal lines, metal vias, and a TSV connector is formed in the second dielectric layer and the second etch stop layer. The metal lines and metal vias formed in the $M_{N+2}$ layer are electrically connected to the underlying metal lines in the TSV insert metallization layer (i.e., the $M_{N+1}$ layer). The TSV connector is connected to a top surface of the TSV and allows the TSV to connect to a conductive element above the $M_{N+1}$ layer.

Figure 5:
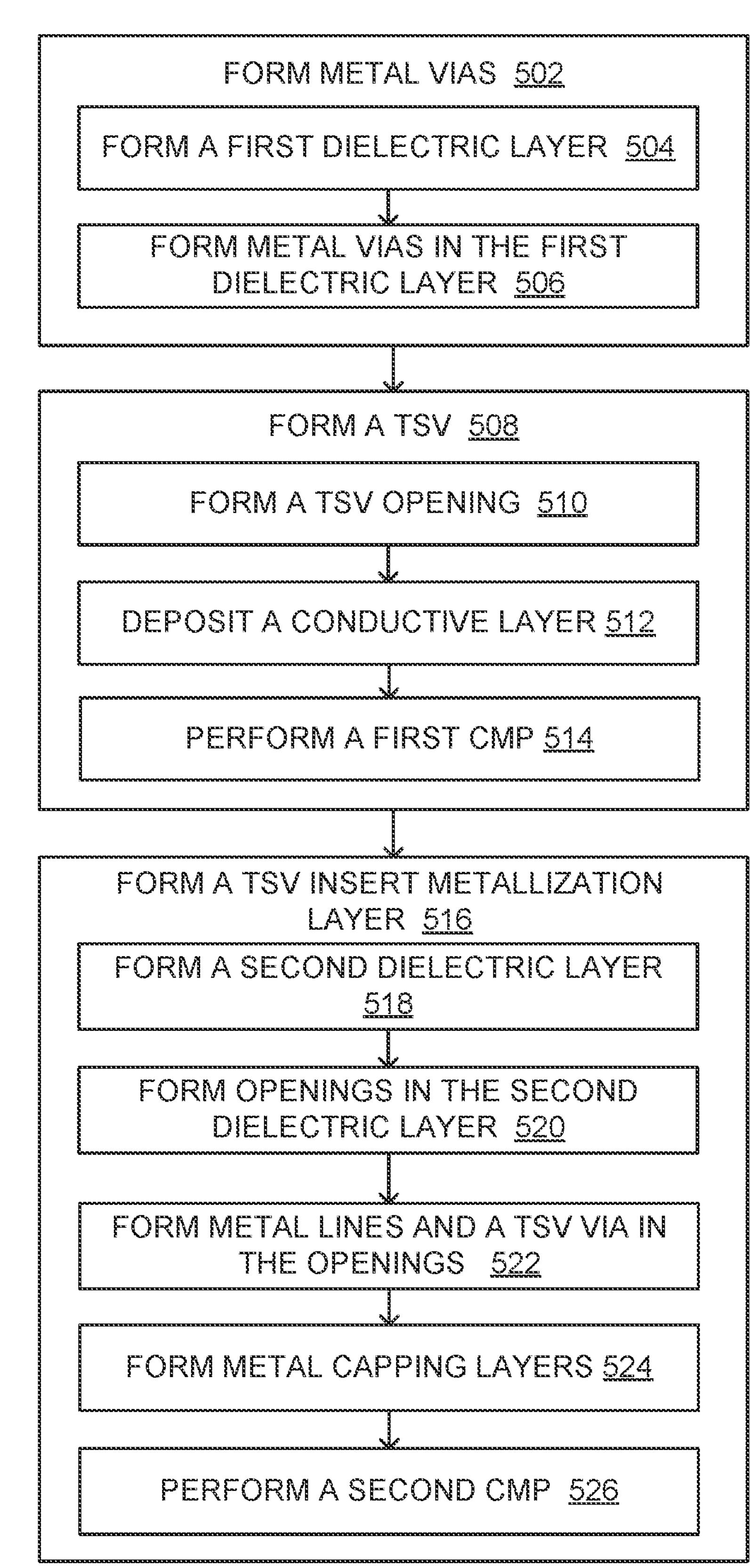
FIG. 5 is a flow chart illustrating an example method for forming another semiconductor structure, in accordance with some embodiments.

FIG. 5 is a flow diagram illustrating a method 500 for forming a semiconductor structure 200 having a TSV structure according to some embodiments. As described above, the cross-sectional views of the examples shown in FIGS. 2A-2F are also illustrative for operations of the method 500. The method 500 is a close variation of the method 400, and the semiconductor structure 200 is a close variation of the semiconductor structure 100 shown in FIGS. 1A-1L. In the example shown in FIG. 5, the method 500 includes operations 502, 504, 506, 508, 510, 512, 514, 516, 518, 520, 522, 524, and 526. Additional operations may be performed. Also, it should be understood that the sequence of the various operations discussed above with reference to FIG. 5 is provided for illustrative purposes, and as such, other embodiments may utilize different sequences. These various sequences of operations are to be included within the scope of embodiments.

At 502, metal vias are formed on a provided semiconductor structure. The provided semiconductor structure includes a substrate and an MLI structure on the substrate, and the MLI structure includes multiple metallization layers denoted as $M_i$ layers, wherein i=0, 1, . . . N, N is an integer, and N>1. The $M_N$ layer is the topmost metallization layer. The $M_i$ layers (i=0, 1, . . . N) may be non-TSV insert metallization layers.

Operation 502 may include operations 504 and 506. At 504, a first dielectric layer is formed. In some embodiments, a first etch stop layer is formed on the topmost metallization layer $M_N$ layer, and the first dielectric layer is formed on the first etch stop layer. At 506, metal vias are formed in the first dielectric layer and the first etch stop layer and connected to the underlying metal lines in the $M_N$ layer. The metal vias may be formed by a single damascene process including forming via openings, depositing a conductive layer to fill the via openings, and then performing a CMP process to planarize the top surfaces of the metal vias.

At 508, a TSV is formed. Operation 508 may include operations 510, 512, and 514. At 510, a TSV opening is formed. At 512, a conductive layer is deposited and fills the TSV opening. At 514, a first CMP process is performed to form the TSV and planarize the top surface of the TSV. The top surface of the TSV is coplanar with the top surfaces of the metal vias.

At 516, a TSV insert metallization layer is formed. Operation 516 may include operations 518, 520, 522, 524, and 526. At 518, a second dielectric layer is formed on the metal vias and TSV. At 520, openings and a TSV opening are formed in the second dielectric layer to expose the top surfaces of the metal vias and the TSV. At 522, metal lines are formed in the openings and a TSV connector is formed in the TSV opening. At 524, metal capping layers are formed on the metal lines and the TSV connector or in a top portion of the metal lines and the TSV connector. At 526, a second CMP process is performed to planarize the top surfaces of the metal capping layers. The metal lines and metal vias are constituents of the TSV insert metallization layer (i.e., the $M_{N+1}$ layer). The TSV insert metallization layer is formed after the TSV is formed, thus the metal capping layers of the metal lines and the TSV connector only undergo one CMP treatment (i.e., the second CMP process) but is treated by the CMP process for forming the TSV. In some embodiments, the metal capping layers included in the TSV insert metallization layer have a thickness substantially the same as the thickness of the metal capping layers included in the non-TSV insert metallization layers, with a deviation no more than 10%.

One or more additional metallization layers (i.e., $M_{N+2}$ layer) may be formed on the $M_{N+1}$ layer, and one or more additional TSV connectors may be formed in the additional metallization layers to connect the TSV to a metal feature in or above the additional metallization layers.

SUMMARY

In accordance with some aspects of the disclosure, a method is provided. In some embodiments, the method includes forming a first dielectric layer on a semiconductor structure. The semiconductor structure includes a substrate and a multi-layer interconnect (MLI) structure on the substrate. The MLI structure includes a plurality of metallization layers sequentially formed on the substrate, each metallization layer further includes a plurality of metal lines, and each metal line includes a metal capping layer in a top portion of the metal line. The first dielectric layer is formed on a topmost metallization layer of the plurality of metallization layers. The method further includes forming a through-substrate-via (TSV) opening. The TSV opening extends vertically through the first dielectric layer and the plurality of metallization layers into the substrate. The method further includes filling a conductive material in the TSV opening to form a TSV, performing a first planarization process on the conductive material and the first dielectric layer, forming a plurality of first metal vias and a corresponding plurality of first metal lines in the first dielectric layer after performing the first planarization process. The first metal vias respectively connect the corresponding first metal lines to the metal lines in the topmost metallization layer. The method further includes forming a plurality of first metal capping layer respectively on the plurality of first metal lines and performing a second planarization process to planarize the first metal capping layer.

In accordance with some aspects of the disclosure, a method is provided. In some embodiments, the method includes forming a first dielectric layer on a semiconductor structure. The semiconductor structure includes a substrate and an MLI structure on the substrate, the MLI structure includes a plurality of metallization layers sequentially formed on the substrate, each metallization layer further includes a plurality of metal lines, and each metal line includes a metal capping layer in a top portion of the metal line. The first dielectric layer is formed on a topmost metallization layer of the plurality of metallization layers. The method further includes forming a plurality of first metal vias in the first dielectric layer, and each first metal via is connected to one of the metal lines in the topmost metallization layer under the first dielectric layer. The method further includes forming a TSV opening, and the TSV opening extends vertically through the first dielectric layer and the plurality of metallization layers into the substrate. The method further includes filling a conductive material in the TSV opening to form a TSV, performing a first planarization process on the conductive material and the first dielectric layer, forming a second dielectric layer on the first dielectric layer after performing the first planarization process, forming a plurality of first metal lines in the second dielectric layer, and each one of the first metal line is connected to one of the metal vias in the first dielectric layer. The method further includes forming a plurality of first metal capping layers respectively on the plurality of first metal lines and performing a second planarization process to planarize the first metal capping layer.

In accordance with some aspects of the disclosure, a semiconductor structure is provided. In some embodiments, the semiconductor structure includes a substrate, an MLI structure, and a TSV. The MLI structure includes a base metallization layer ($M_0$ layer) disposed on the substrate and a plurality of metallization layers ($M_i$ layers) sequentially formed on the $M_0$ layer. $M_i$ represents the $i^{th}$ metallization layer of the plurality of metallization layers, i is an integer and i≥1, the $M_i$ layers further includes an $N^{th}$ metallization layer ($M_N$ layer), N is an integer and N>1. Each one of the $M_i$ layers further includes a dielectric layer, a plurality of metal lines formed in the dielectric layer, and at least one metal via. Each metal line further includes a metal capping layer formed in a top portion of the metal line, and the metal capping layers of the metal lines included in the plurality of metallization layers except the $M_N$ layer have an average thickness. The at least one metal via is electrically connecting one of the metal lines in the $M_i$ layer to one of the metal lines in the $M_{i-1}$ layer. The TSV extends vertically from a top surface to a bottom surface. The top surface of the TSV is in the dielectric layer of the $M_N$ layer, and the bottom surface of the TSV is in the substrate. The metal capping layers of the metal lines included in the $M_N$ layer have a thickness substantially the same as the average thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first dielectric layer on a semiconductor structure, wherein the semiconductor structure comprises a substrate and a multi-layer interconnect (MLI) structure on the substrate, the MLI structure comprises a plurality of metallization layers sequentially formed on the substrate, each metallization layer further comprises a plurality of metal lines, each metal line comprises a metal capping layer in a top portion of the metal line, and the first dielectric layer is formed on a topmost metallization layer of the plurality of metallization layers;

forming a through-substrate-via (TSV) opening, the TSV opening extending vertically through the first dielectric layer and the plurality of metallization layers into the substrate;

filling a conductive material in the TSV opening to form a TSV;

performing a first planarization process on the conductive material and the first dielectric layer;

after performing the first planarization process, forming a plurality of first metal vias and a corresponding plurality of first metal lines in the first dielectric layer, wherein the first metal vias respectively connect the corresponding first metal lines to the metal lines in the topmost metallization layer;

forming a plurality of first metal capping layers respectively on the plurality of first metal lines; and performing a second planarization process to planarize the first metal capping layers.

2. The method of claim 1, wherein the metal capping layers of the metal lines in the MLI structure have an average thickness, and each first metal capping layer on the first metal line has a thickness substantially the same as the average thickness with a deviation of no more than 10%.

3. The method of claim 1, wherein the metal capping layers and the first metal capping layers comprise a capping element, and the capping element is a transition metal selected from the group of cobalt (Co), tungsten (W), tantalum (Ta), nickel (Ni), molybdenum (Mo), manganese (Mn), titanium (Ti), and iron (Fe).

4. The method of claim 1, further comprising:

forming a second dielectric layer on the first dielectric layer; and forming a plurality of second metal vias and a corresponding plurality of second metal lines in the second dielectric layer, wherein each second metal via is positioned under the corresponding second metal line and electrically connects the corresponding second metal line in the second dielectric layer to one of the first metal lines in the first dielectric layer.

5. The method of claim 4, further comprising:

forming at least one TSV connector in the second dielectric layer, the TSV connector vertically aligned with the TSV and extending from a top surface of the second dielectric layer to a top surface of the TSV, wherein the TSV connector is configured to electrically connect the TSV to a metal feature above the second dielectric layer.

6. The method of claim 5, wherein the TSV connector and the second metal lines and the second metal vias are formed simultaneously.

7. The method of claim 6, further comprising:

forming a second metal capping layer on each one of the second metal lines and the TSV connector.

8. A method, comprising:

forming a first dielectric layer on a semiconductor structure, wherein the semiconductor structure comprises a substrate and an MLI structure on the substrate, the MLI structure comprises a plurality of metallization layers sequentially formed on the substrate, each metallization layer further comprises a plurality of metal lines, each metal line comprises a metal capping layer in a top portion of the metal line, and the first dielectric layer is formed on a topmost metallization layer of the plurality of metallization layers;

forming a plurality of first metal vias in the first dielectric layer, each first metal via connected to one of the metal lines in the topmost metallization layer under the first dielectric layer;

forming a TSV opening, the TSV opening extending vertically through the first dielectric layer and the plurality of metallization layers into the substrate;

filling a conductive material in the TSV opening to form a TSV;

performing a first planarization process on the conductive material and the first dielectric layer;

after performing the first planarization process, forming a second dielectric layer on the first dielectric layer;

forming a plurality of first metal lines in the second dielectric layer, wherein each one of the first metal lines is connected to one of the metal vias in the first dielectric layer;

forming a plurality of first metal capping layers respectively on the plurality of first metal lines; and performing a second planarization process to planarize the first metal capping layers.

9. The method of claim 8, further comprising:

forming a first TSV connector in the second dielectric layer, the first TSV connector vertically aligned with the TSV and extending from a top surface of the second dielectric layer to a top surface of the TSV, wherein the first TSV connector is configured to electrically connect the TSV to a metal feature above the second dielectric layer.

10. The method of claim 9, wherein the first TSV connector and the first metal lines are formed simultaneously.

11. The method of claim 10, further comprising:

forming a first metal capping layer on each one of the first metal lines and the first TSV connector.

12. The method of claim 8, wherein the metal capping layers on the metal lines of the MLI structure have an average thickness, and each first metal capping layer on the first metal line has a thickness substantially the same as the average thickness with a deviation of no more than 10%.

13. The method of claim 8, wherein the metal capping layers and the first metal capping layers comprise a capping element, and the capping element is a transition metal selected from the group of cobalt (Co), tungsten (W), tantalum (Ta), nickel (Ni), molybdenum (Mo), manganese (Mn), titanium (Ti), and iron (Fe).

14. The method of claim 9, further comprising:

forming a third dielectric layer on the second dielectric layer; and forming a plurality of second metal vias and a corresponding plurality of second metal lines in the third dielectric layer, wherein each second metal via is positioned under the corresponding second metal line and electrically connects the corresponding second metal line in the third dielectric layer to one of the first metal lines in the second dielectric layer.

15. The method of claim 14, further comprising:

forming a second TSV connector in the third dielectric layer, the second TSV connector vertically aligned with the first TSV and extending from a top surface of the third dielectric layer to a top surface of the first TSV connector, wherein the second TSV connector is configured to electrically connect the first TSV connector to a metal feature above the third dielectric layer.

16. A semiconductor structure, comprising:

a substrate;

an MLI structure, the MLI structure comprising a base metallization layer ($M_0$ layer) disposed on the substrate and a plurality of metallization layers ($M_i$ layers) sequentially formed on the $M_0$ layer, wherein $M_i$ represents the $i^{th}$ metallization layer of the plurality of metallization layers, i is an integer and i≥1, the $M_i$ layers further includes an $N^{th}$ metallization layer ($M_N$ layer), N is an integer and N>1, and each one of the $M_i$ layers further comprises:

a dielectric layer; and a plurality of metal lines formed in the dielectric layer, wherein each metal line further comprises a metal capping layer formed in a top portion of the metal line, and the metal capping layers of the metal lines included in the plurality of metallization layers except the $M_N$ layer have an average thickness; and at least one metal via electrically connecting one of the metal lines in the $M_i$ layer to one of the metal lines in a $M_{i-1}$ layer, and a TSV extending vertically from a top surface to a bottom surface, wherein the top surface of the TSV is in the dielectric layer of the $M_N$ layer, the bottom surface is in the substrate, the metal capping layers of the metal lines included in the $M_N$ layer have a thickness substantially the same as the average thickness;

wherein the top surface of the TSV is below a top surface of the dielectric layer of the $M_N$ layer, the $M_N$ layer further comprises a TSV connector formed in the dielectric layer of the $M_N$ layer, the TSV connector extends from the top surface of the dielectric layer to the top surface of the TSV, and the TSV connector is vertically aligned with and electrically connected to the TSV.

17. The semiconductor structure of claim 16, wherein the thickness of the metal capping layers of the metal lines included in the $M_N$ layer has a deviation from the average thickness, and the deviation is of no more than 10%.

18. The semiconductor structure of claim 16, wherein the metal capping layers comprise a capping element, and the capping element is a transition metal selected from the group consisting of cobalt (Co), tungsten (W), tantalum (Ta), nickel (Ni), molybdenum (Mo), manganese (Mn), titanium (Ti), and iron (Fe).

19. The semiconductor structure of claim 16, wherein the TSV connector comprises a metal capping layer formed in a top portion of the TSV connector, and the metal capping layer of the TSV connector has a thickness substantially the same as the average thickness.

20. The semiconductor structure of claim 16, wherein the TSV connector has a horizontal dimension larger than a horizontal dimension of the TSV, such that the TSV connector covers the top surface of the TSV.

* * * * *